(12) United States Patent
Zundel et al.

(10) Patent No.: US 9,397,091 B2
(45) Date of Patent: Jul. 19, 2016

(54) SEMICONDUCTOR COMPONENT ARRANGEMENT COMPRISING A TRENCH TRANSISTOR

(71) Applicant: Infineon Technologies AG, Neubiberg (DE)

(72) Inventors: Markus Zundel, Egmating (DE); Franz Hirler, Isen (DE); Norbert Krischke, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/330,847

(22) Filed: Jul. 14, 2014

(65) Prior Publication Data

US 2015/0008498 A1    Jan. 8, 2015

Related U.S. Application Data

(63) Continuation of application No. 12/987,852, filed on Jan. 10, 2011, now Pat. No. 8,779,506, which is a continuation of application No. 11/715,275, filed on Mar. 7, 2007, now Pat. No. 7,868,363.

(30) Foreign Application Priority Data

Mar. 7, 2006   (DE) .................. 10 2006 010 510

(51) Int. Cl.
*H01L 27/06*    (2006.01)
*H01L 27/07*    (2006.01)
(Continued)

(52) U.S. Cl.
CPC ...... *H01L 27/0733* (2013.01); *H01L 21/32105* (2013.01); *H01L 21/743* (2013.01); *H01L 28/40* (2013.01); *H01L 29/407* (2013.01); *H01L 29/41766* (2013.01); *H01L 29/66712* (2013.01); *H01L 29/66734* (2013.01);
(Continued)

(58) Field of Classification Search
CPC ............ H01L 27/0733; H01L 29/7803; H01L 29/7809; H01L 28/40; H01L 29/66712; H01L 29/407; H01L 21/32105; H01L 21/743; H01L 29/41766; H01L 29/66734; H01L 29/7804; H01L 29/7813; H01L 29/7816; H01L 29/945; H01L 29/0696
USPC .......................... 257/302, 228, 327–330, 432
See application file for complete search history.

(56) References Cited

U.S. PATENT DOCUMENTS 4,912,535 A   3/1990 Okumura
5,016,070 A   5/1991 Sundaresan
(Continued)

FOREIGN PATENT DOCUMENTS

DE    10063443 A1    7/2002
DE    10339455 B3    5/2005
(Continued)

*Primary Examiner* — Thanh T Nguyen
(74) *Attorney, Agent, or Firm* — Maginot, Moore & Beck LLP

(57) ABSTRACT

A semiconductor component arrangement method includes producing a trench transistor structure including at least one trench disposed in the semiconductor body and at least one gate electrode disposed in the at least one trench. The method also includes producing a capacitor structure comprising an electrode structure disposed in at least one further trench, the electrode structure comprising at least one electrode. The gate electrode and the at least one electrode of the electrode structure are produced by common process steps.

16 Claims, 20 Drawing Sheets

(51) Int. Cl.
  *H01L 21/74* (2006.01)
  *H01L 49/02* (2006.01)
  *H01L 29/40* (2006.01)
  *H01L 29/417* (2006.01)
  *H01L 29/66* (2006.01)
  *H01L 29/78* (2006.01)
  *H01L 29/94* (2006.01)
  *H01L 21/321* (2006.01)
  *H01L 29/06* (2006.01)

(52) U.S. Cl.
  CPC ....... *H01L 29/7803* (2013.01); *H01L 29/7804* (2013.01); *H01L 29/7809* (2013.01); *H01L 29/7813* (2013.01); *H01L 29/7816* (2013.01); *H01L 29/945* (2013.01); *H01L 29/0696* (2013.01)

(56) References Cited

U.S. PATENT DOCUMENTS

| | | |
|---|---|---|
| 5,283,461 A | 2/1994 | Beasom |
| 5,316,959 A | 5/1994 | Kwan et al. |
| 5,317,432 A * | 5/1994 | Ino .................. 349/39 |
| 5,479,041 A | 12/1995 | Lur et al. |
| 5,959,325 A * | 9/1999 | Adair et al. ............. 257/302 |
| 6,391,705 B1 | 5/2002 | Hsiao |
| 6,635,535 B2 | 10/2003 | Hao |
| 7,166,891 B2 | 1/2007 | Yoshimochi |
| 7,173,306 B2 | 2/2007 | Hirler et al. |
| 7,868,363 B2 | 1/2011 | Zundel |
| 2002/0024092 A1 | 2/2002 | Palm |
| 2003/0071357 A1 | 4/2003 | Trivedi |
| 2004/0266088 A1 | 12/2004 | Luyken |
| 2005/0082591 A1* | 4/2005 | Hirler et al. ............. 257/302 |
| 2005/0167742 A1 | 8/2005 | Challa et al. |
| 2005/0258464 A1 | 11/2005 | Zundel et al. |
| 2006/0033181 A1 | 2/2006 | Farrar et al. |
| 2006/0054959 A1 | 3/2006 | Mauder et al. |
| 2011/0163366 A1 | 7/2011 | Zundel |

FOREIGN PATENT DOCUMENTS

| | | |
|---|---|---|
| DE | 102004021393 A1 | 12/2005 |
| DE | 102004044619 A1 | 3/2006 |
| EP | 0321763 | 6/1989 |

* cited by examiner

Z-Z

B-B

A-A

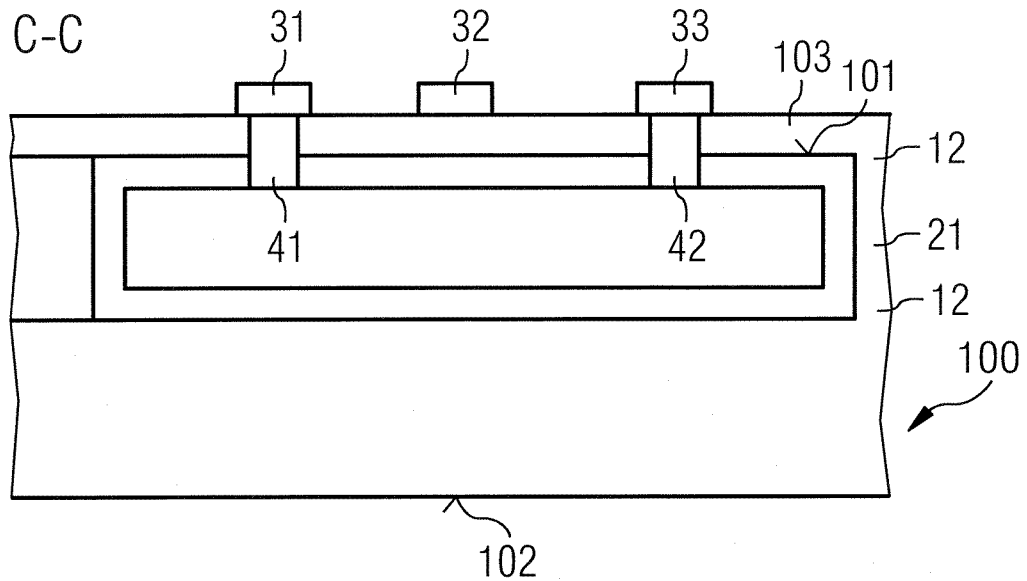
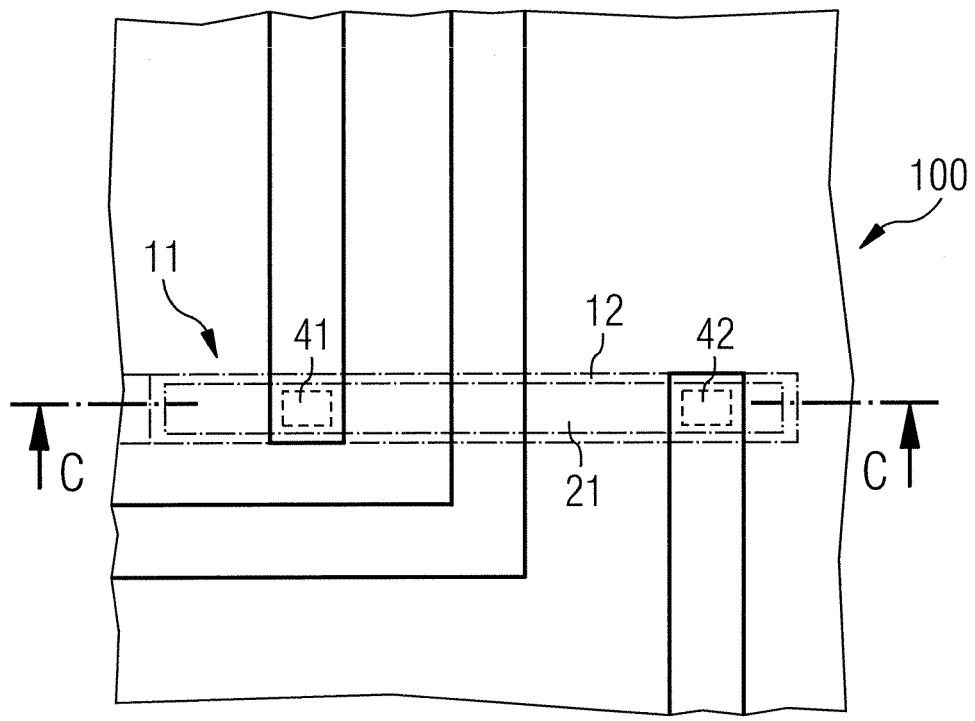

D-D

E-E

G-G

H-H

J-J

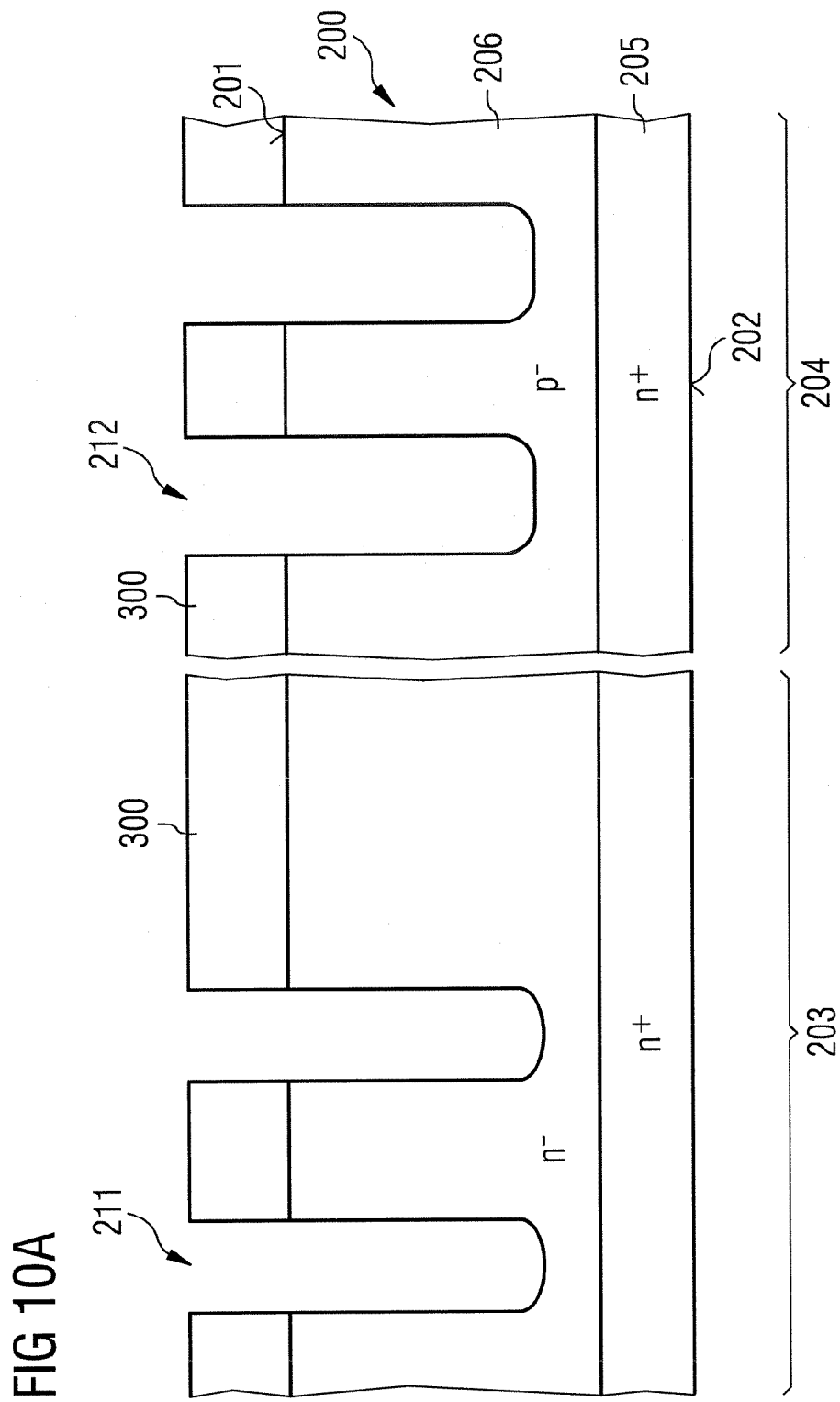

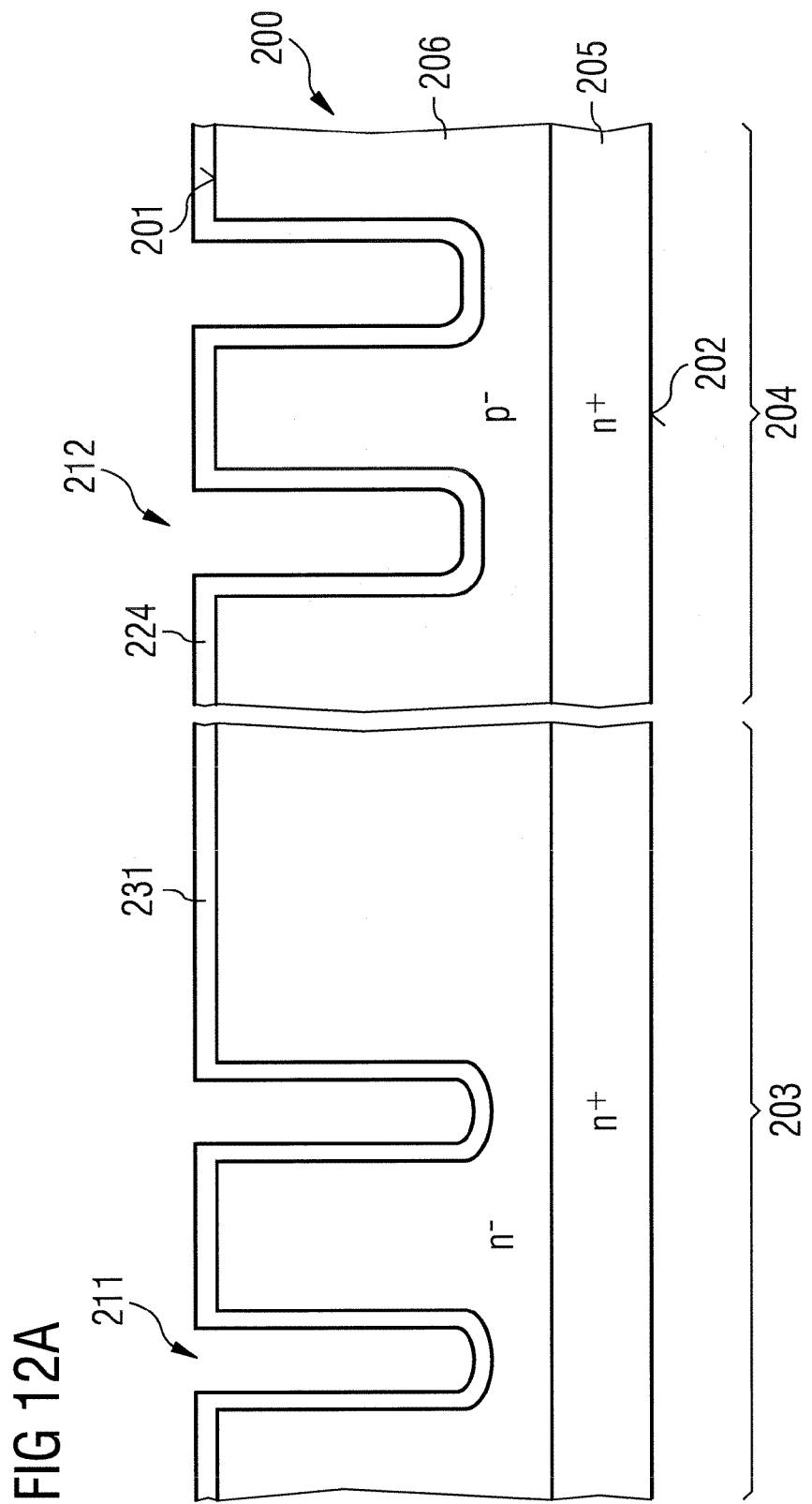

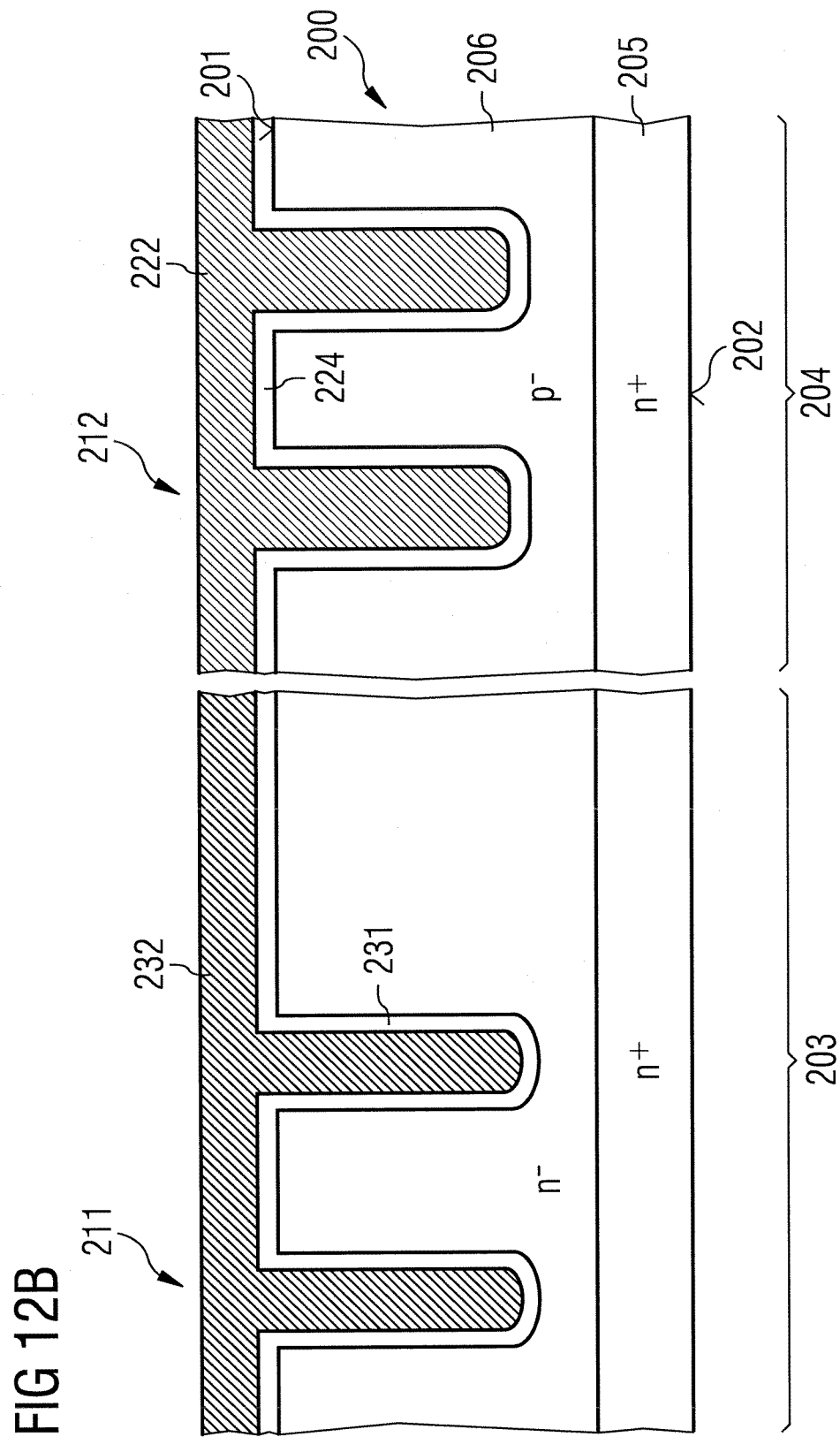

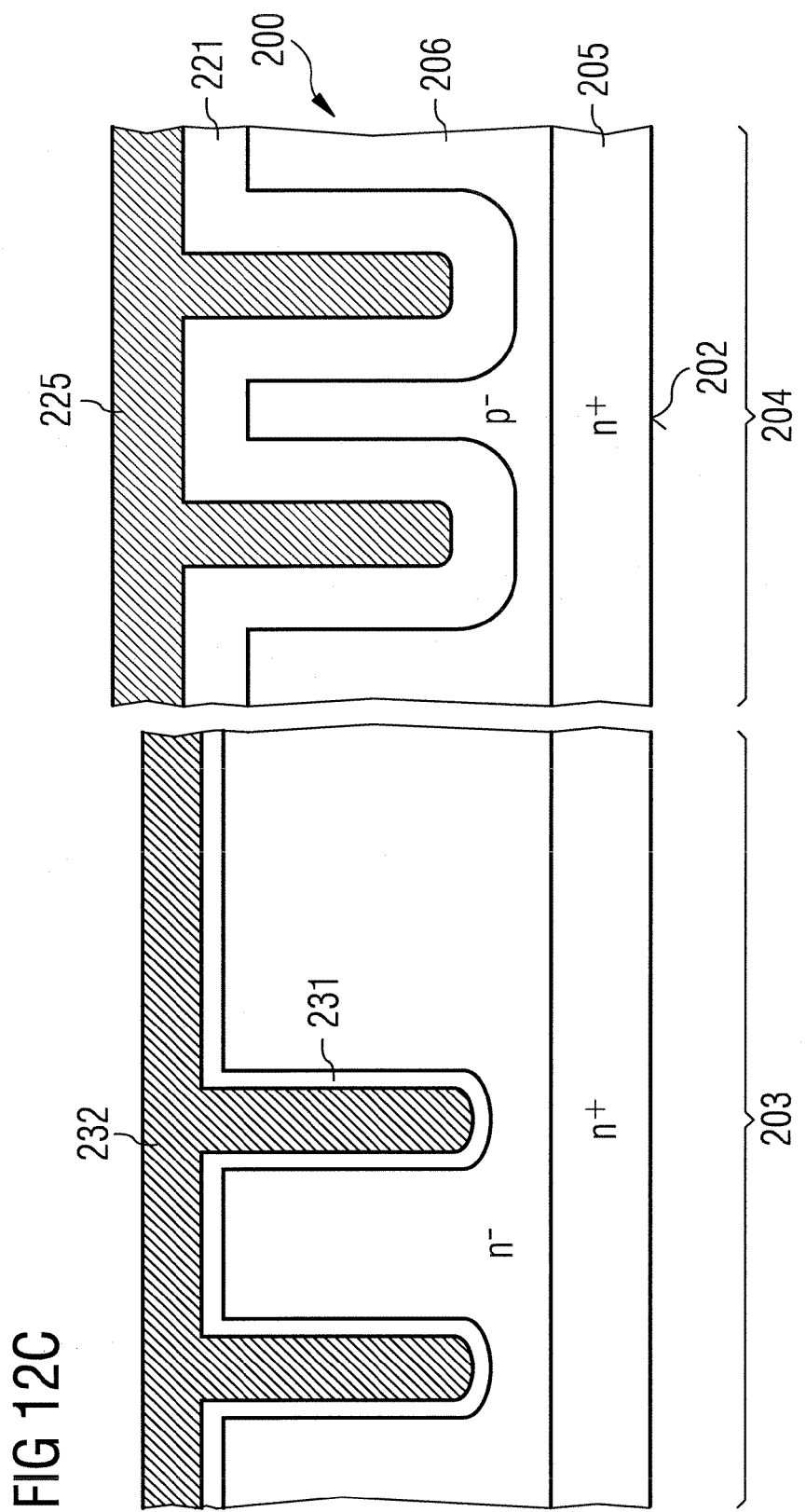

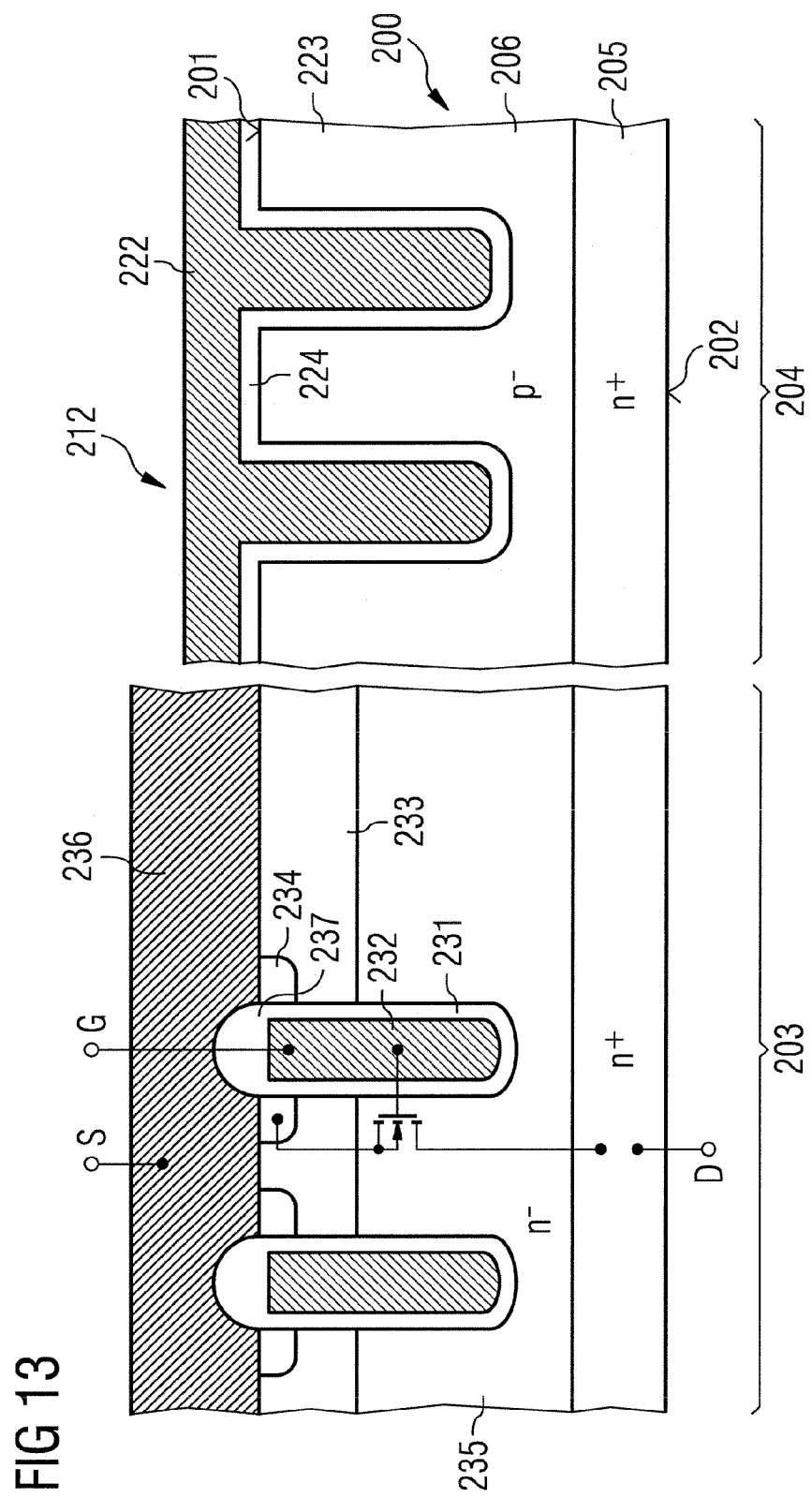

SEMICONDUCTOR COMPONENT ARRANGEMENT COMPRISING A TRENCH TRANSISTOR

This application is a continuation of U.S. patent application Ser. No. 12/987,852, filed Jan. 10, 2011, which in turn is a continuation of U.S. patent application Ser. No. 11/715,275, filed Mar. 7, 2007, now U.S. Pat. No. 7,868,363, which in turn claims priority from German Patent Application No. 10 2006 010510.9-33, which was filed on Mar. 7, 2006, all of which are incorporated herein by reference in their entirety.

FIELD

The present invention relates to a method of producing a semiconductor component arrangement comprising a trench transistor and to a semiconductor component arrangement comprising a trench transistor.

BACKGROUND

In order to connect a plurality of components in a semiconductor body or semiconductor chip to one another to form an integrated circuit or in order to connect the components integrated in a semiconductor body to terminal contacts for an external interconnection, connection lines also have to be produced during the production process for producing the components.

In known "smart power IC technologies", that is to say technologies which enable a realization of power components, in particular power transistors, and logic components in one semiconductor chip, often only two wiring levels above one side of the semiconductor body are available for the realization of such connection lines or wirings, one of which levels comprises metal lines, for example, and the other level comprises lines composed of polysilicon.

If there are a multiplicity of components in the semiconductor body, in particular a multiplicity of logic components, which are to be interconnected with one another, space problems may occur. In the case of such a circuit, it is necessary to interconnect individual logic gates, in particular, and also individual circuit blocks, which may in each case comprise a plurality of components. What is more, it may be necessary to produce bridgings by means of which two lines of the metallization level that are arranged in a manner spaced apart from one another are conductively connected to one another.

Depending on the function of the integrated circuit it may become necessary to realize capacitor structures or further electrode structures in the same semiconductor body as the trench transistor.

SUMMARY

According to one embodiment of the invention, a method for producing a semiconductor component arrangement comprises producing a trench transistor structure with at least one trench disposed in the semiconductor body and with at least an gate electrode disposed in the at least one trench. In addition, an electrode structure is disposed in at least one further trench and comprising at least one electrode. In this method, the at least one trench of the transistor structure and the at least one further trench are produced by common process steps, and the at least one electrode of the electrode structure and the gate electrode are produced by common process steps.

According to another embodiment of the invention, a semiconductor component arrangement comprises a semiconductor body having a first side and a second side. A trench transistor structure is integrated in the semiconductor body and comprises at least one trench and in said trench at least one gate electrode. At least one electrode structure is disposed in at least one further trench and comprises at least one electrode which in at least one section has the same geometrical structure as the gate electrode.

In various embodiments, the electrode structure may be part of a wiring structure/connection line structure or may be part of a capacitor structure.

Within such a trench it is possible to provide a plurality of separate trench connection lines which are arranged one above another in the trench in a vertical direction of the semiconductor body. It goes without saying that it is also possible to provide only one trench connection line in the trench, which trench connection line may then have a cross section of a size in line with the need for realizing a low-resistance line connection.

The trench connection line comprises an arbitrary electrically conductive material, for example a doped polycrystalline semiconductor material, such as polysilicon, a metal-semiconductor compound, such as, for example, a silicide, or a metal, such as, for example, titanium, tungsten or platinum.

The above-mentioned features and advantages, as well as others, will become more readily apparent to those of ordinary skill in the art by reference to the following detailed description and accompanying drawings. The teachings disclosed herein extend to those embodiments which fall within the scope of the appended claims, regardless of whether they include one or more of the above-mentioned features or accomplish one or more of the above-mentioned advantages.

BRIEF DESCRIPTION OF THE DRAWINGS

Embodiments of the present invention are explained in more detail below with reference to figures.

FIG. 3A shows a cross sectional view of a semiconductor body with a trench connection line which connects two interconnects arranged above a surface of the semiconductor body to one another.

FIG. 3B shows a plan view of the semiconductor body of FIG. 3A.

FIG. 10A illustrates a side view of a cross section of a trench power transistor structure and a capacitor structure in a common semiconductor body after performance of a first step of a production method.

FIG. 12A illustrates a side view of a cross section of structures of a semiconductor body after performance of a first step of a method modified from that shown in FIGS. 10A-10E.

FIG. 12B illustrates the structures shown in FIG. 12A after performance of further steps of the method.

FIG. 12C illustrates the structures shown in FIG. 12B after performance of further steps of the method.

FIG. 13 shows the result of a modification of the method according to FIGS. 12A-12C.

In the figures, unless specified otherwise, identical reference symbols designate identical component regions with the same meaning.

DETAILED DESCRIPTION OF THE DRAWINGS

Figure 1A:
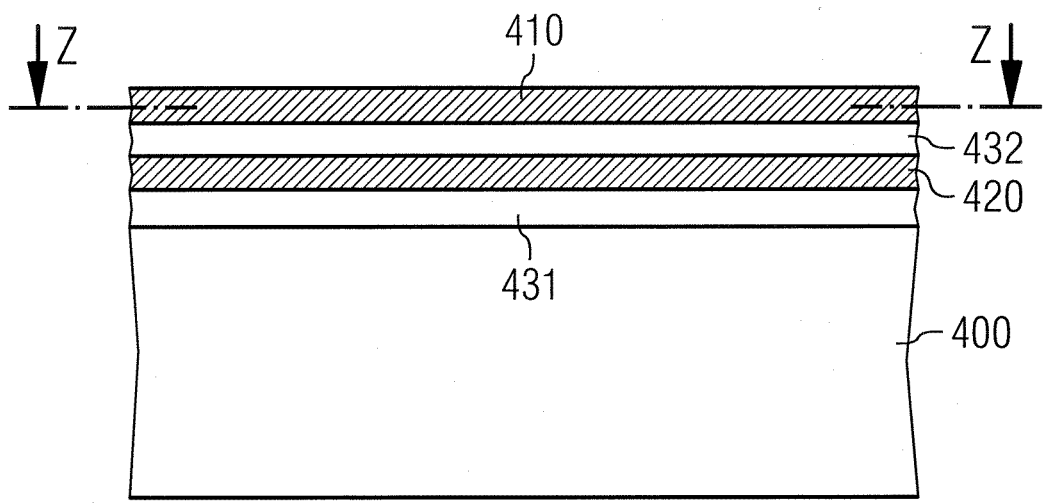
FIG. 1A shows a cross sectional view of a wiring concept for an integrated circuit arrangement according to the prior art.
Figure 1B:
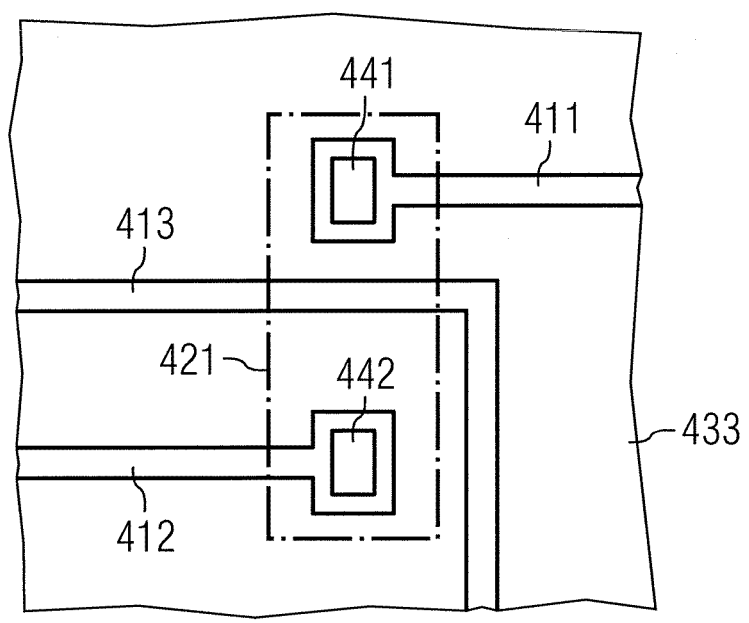
FIG. 1B shows a cross sectional view of the wiring concept of FIG. 1A.

FIG. 1A shows a cross section of a component arrangement comprising a semiconductor body 400, on which are arranged two wiring levels, a first wiring level 420 composed of polysilicon and a second wiring level 410 composed of a metal, which are insulated from one another and from the semiconductor body by insulation layers 431, 432, for example an oxide. "Wiring level" is to be understood hereinafter to mean a layer composed of electrically conductive material which is patterned in such a way that a plurality of interconnects arranged separately from one another are present. The cross section through the metallization level 410 as illustrated in FIG. 1B shows three of such lines 411, 412, 413, which are arranged in a manner spaced apart from one another and which are in each case insulated from one another by an insulation material 433 arranged in the metallization level. In FIG. 1B, the reference symbol 421 designates a polysilicon bridge which conductively connects two 411, 412 of the interconnects to one another. Said polysilicon bridge is arranged in the polysilicon level, and thus below the metallization level, and is illustrated in dash-dotted fashion in FIG. 1B. Conductive connections between the metal lines 411, 412 and the polysilicon bridge 421 are realized by vertically running connections, so-called vias, which in each case extend in a vertical direction through the insulation layer 432 that isolates the metallization level 420 and the polysilicon level 410.

Although the polysilicon used for realizing the polysilicon level 410 is highly doped, its resistivity is usually higher than the material used for the metallization level 420. In order to achieve a connection of the two interconnects 411, 412 which has the lowest possible resistance, a largest possible area is required for the polysilicon bridge 421, which can therefore lead to space problems if a multiplicity of such "bridgings" have to be realized in the circuit.

Figure 2A:
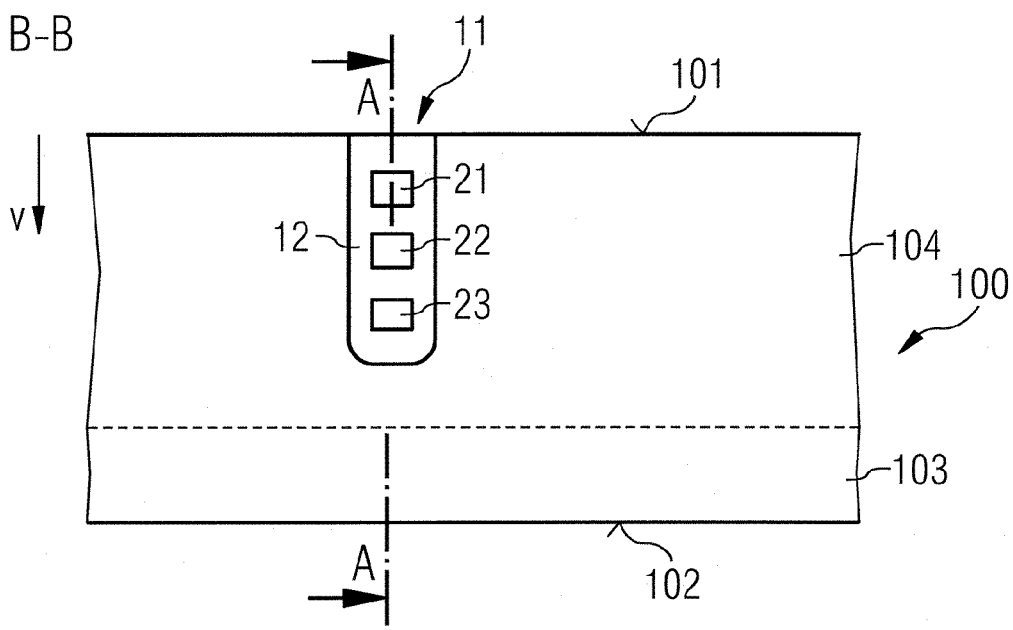
FIG. 2A shows a transverse view of a first exemplary embodiment of a semiconductor component arrangement comprising a trench line connection.
Figure 2B:
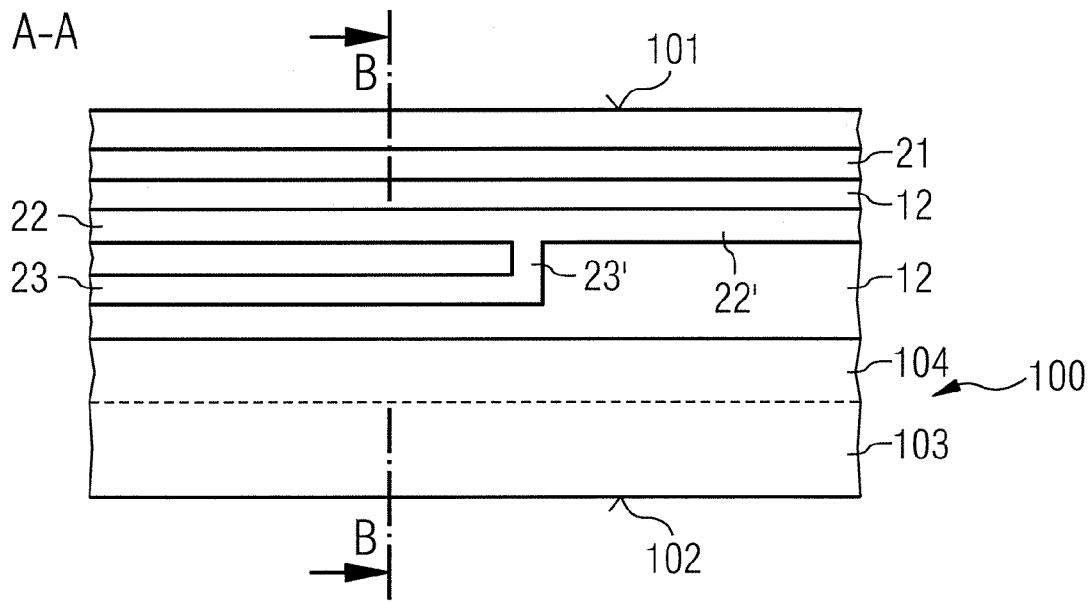
FIG. 2B shows a top view of the semiconductor component arrangement of FIG. 2A.

FIGS. 2A and 2B illustrate the basic construction of a trench connection line, which serves, in a manner not specifically illustrated in FIG. 2, for electrically conductively connecting two terminal contacts arranged in a semiconductor body or on a semiconductor body.

In FIGS. 2A and 2B, the reference symbol 100 designates a semiconductor body having a first side 101, which is referred to hereinafter as the front side, and a second side 102, which is referred to hereinafter as the rear side. The semiconductor body 100 may be realized in any desired manner and may have, in particular, a semiconductor substrate 103 and an epitaxial layer 104 applied to the semiconductor substrate, which is illustrated in dashed fashion in FIGS. 2A and 2B.

The semiconductor body 100 has a trench 11 extending into the semiconductor body 100 proceeding from the front side 101 in a vertical direction v. FIG. 2A shows said trench in a section B-B transversely with respect to its extending direction, while FIG. 2B shows the trench in a section A-A along its extending direction. At least one trench connection line 21, 22, 23 is arranged in said trench, said trench connection line being insulated from the regions of the semiconductor body 100 that surround the trench 11 by means of an insulation layer 12. The insulation layer 12 is an arbitrary electrically insulating dielectric layer, in particular a semiconductor oxide produced by an oxidation method or a deposited semiconductor oxide.

The example shows three trench connection lines 21, 22, 23 which are arranged one above another in the trench 11 in the vertical direction v of the semiconductor body, in each case two adjacent trench connection lines from among said trench connection lines 21, 22, 23 being insulated from one another by the insulation layer 12.

The individual trench connection lines 21, 22, 23 within the trench 11 may be realized such that they are completely isolated from one another. Moreover, referring to FIG. 2B, there is also the possibility of two of the trench connection lines, in the example the connections 22, 23, being conductively connected to one another by a vertical connection 23' and, after the connection point, only one of the two connection lines, in the example the connection line 22, being continued in the trench 11 in the lateral direction. Such a structure having two connection lines 22, 23 which are isolated from one another in sections and continued jointly starting from a connection point can be used for example for electrically conductively connecting two terminal contacts (not specifically illustrated in FIG. 2B) to one another and jointly connecting them to a further terminal contact. For this purpose, the sections of the connection lines 22, 23 that are led separately from one another are connected to the terminal contacts to be connected and the jointly continued section 22' of the two connection lines is connected to the terminal contact to which the other two terminal contacts are to be electrically conductively connected.

FIGS. 3A and 3B show a cross section (FIG. 3A) and a plan view (FIG. 3B) of a semiconductor body 100, on the front side 101 of which is applied an insulation layer 103, above which separate interconnects 31, 32, 33 are led. Said interconnects comprise for example a metal, for example aluminum, and may be produced by patterning an interconnect layer—which is initially applied over the whole area—by means of an etching method using etching masks.

Three of such interconnects 31, 32, 33 are present in the illustrated section of the semiconductor body 100, which interconnects run parallel to one another in sections and the two outer interconnects 31, 33 of which are to be electrically conductively connected to one another. For this purpose, a trench connection line 21 is provided, which is arranged below the interconnects in a trench 11 within the semiconductor body 100 and which runs transversely with respect to the sections of the interconnects 31, 32, 33 in which said interconnects run parallel to one another. The trench 11 running below the interconnects and having the trench connection line 21 arranged in it, and the insulation layer 12 that insulates the trench connection line 21 from the semiconductor body 100 are illustrated in dash-dotted fashion in FIG. 3B.

In the example illustrated, the trench connection line 21 runs in a manner spaced apart from the front side 101 of the semiconductor body 100 in the vertical direction, with the result that a section of the insulation layer 12 is arranged above the trench connection line 21. In the example illustrated, in which a further insulation layer 103 that insulates the interconnects 31-33 from the semiconductor body is present on the front side 101 of the semiconductor body, the trench connection line 21 could also extend as far as the level of the front side 101 of the semiconductor body 100 (not illustrated).

Vertical terminal connections 41, 42, which are referred to hereinafter as vias, are provided for connecting the interconnects 31, 33 that are to be connected to one another to the trench connection line 21. Said vias 41, 42 extend in the vertical direction from the trench connection line 21 as far as the interconnects 31, 33.

An electrically conductive connection of the interconnects 31, 33 can be realized in a space-saving manner by means of the trench connection line 21 since no space above the front side of the semiconductor body 100 is required for the trench connection line 21.

The resistance of the connection line 21 is crucially determined by the cross section of the trench connection line 21. Said cross section can be set in particular by way of the depth of the trench 11, enough space being available in the vertical direction of the semiconductor body to realize a sufficiently large interconnect cross section for the trench connection line 21.

Figure 4A:
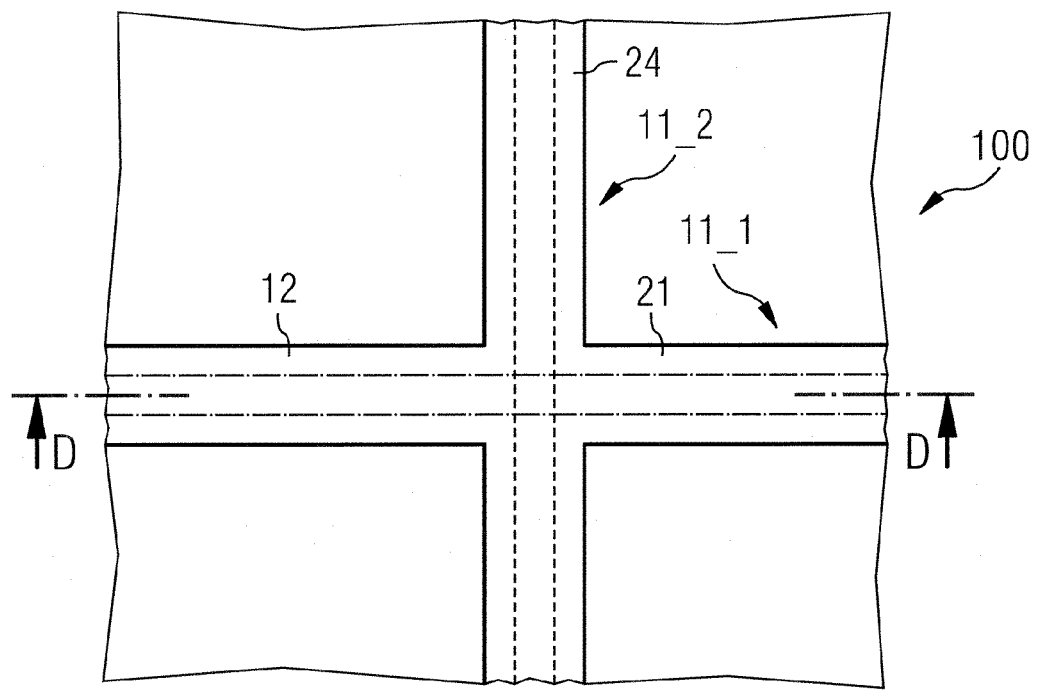
FIG. 4A shows a cross section through a semiconductor body with two mutually crossing trench connection lines.
Figure 4B:
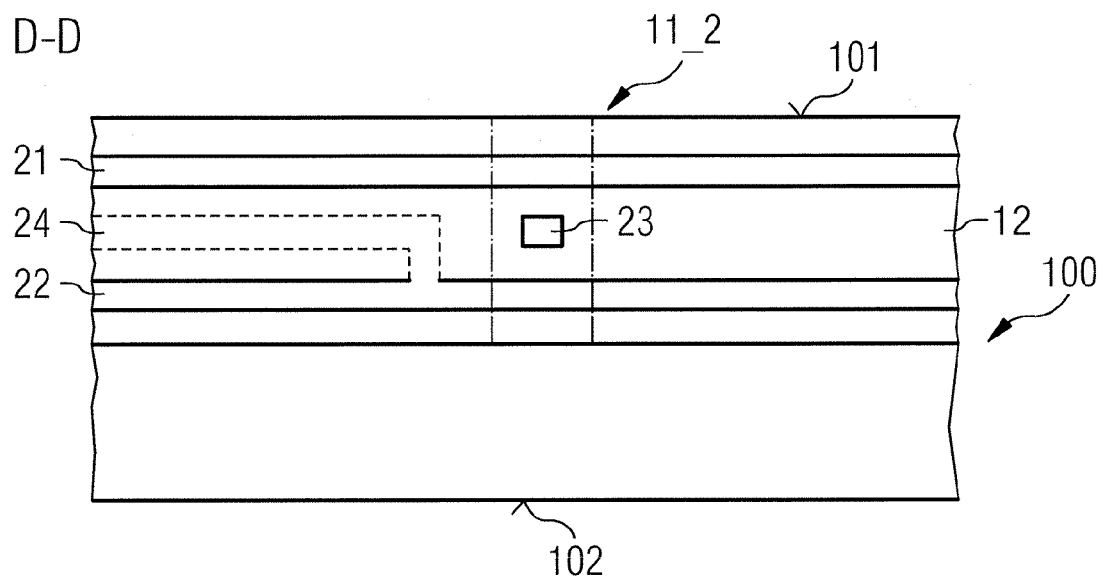
FIG. 4B shows a cross sectional view in a vertical sectional plane of the semiconductor body of FIG. 4A.

Crossovers between two trench connection lines that do not run parallel can also be realized in a simple manner, as is illustrated in FIGS. 4A and 4B. FIG. 4A shows a cross section through a semiconductor body 100 in a plan view of the front side 101. FIG. 4B shows the semiconductor body in cross section in a vertical sectional plane D-D illustrated in FIG. 4A. Two trenches 11_1, 11_2 running perpendicular to one another are arranged in the semiconductor body, in which trenches trench connection lines are in each case realized in different planes. A first and second trench connection line 21, 22 are realized in the first trench, and are arranged in first and second vertical planes, i.e. at a first and second vertical distance from the front side 101. In a further plane different from the first and second planes, a third trench connection line 23 is arranged in the second trench 11_2, which third trench connection line crosses the first and second trench connection lines 21, 22 at the crossover point of the two trenches 11_1, 11_2 in a manner free of contact. The reference symbol 24 designates a further trench connection line in the first trench 11_1, which further trench line connection, within said trench 11_1, does not, however, extend beyond the crossover point of the trenches 11_1, 11_2, but rather is connected to the second trench connection line 22 via a vertical connection 24 before the crossover point.

Figure 5A:
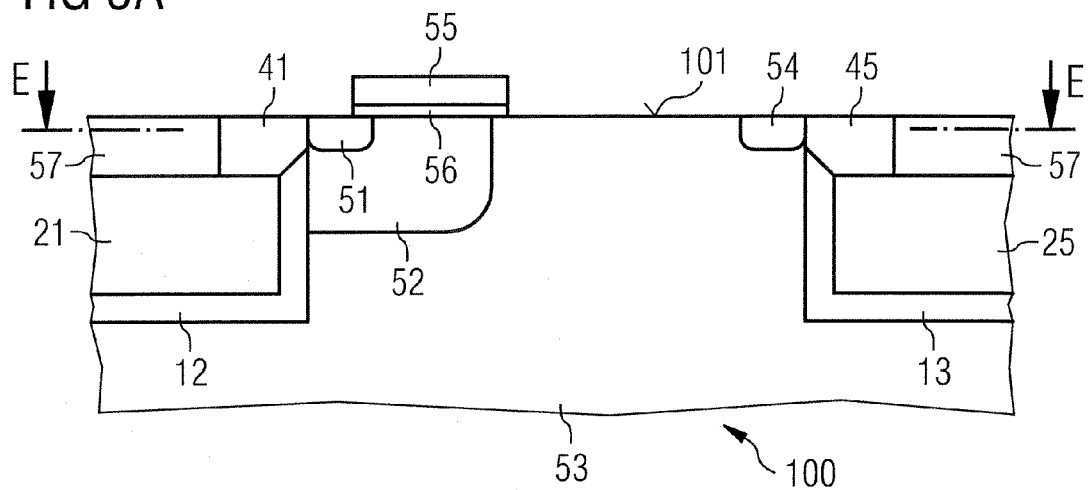
FIG. 5A shows a cross section through a semiconductor body in which a lateral MOS transistor is realized, the source and drain terminals of which are contact-connected by trench connection lines.
Figure 5B:
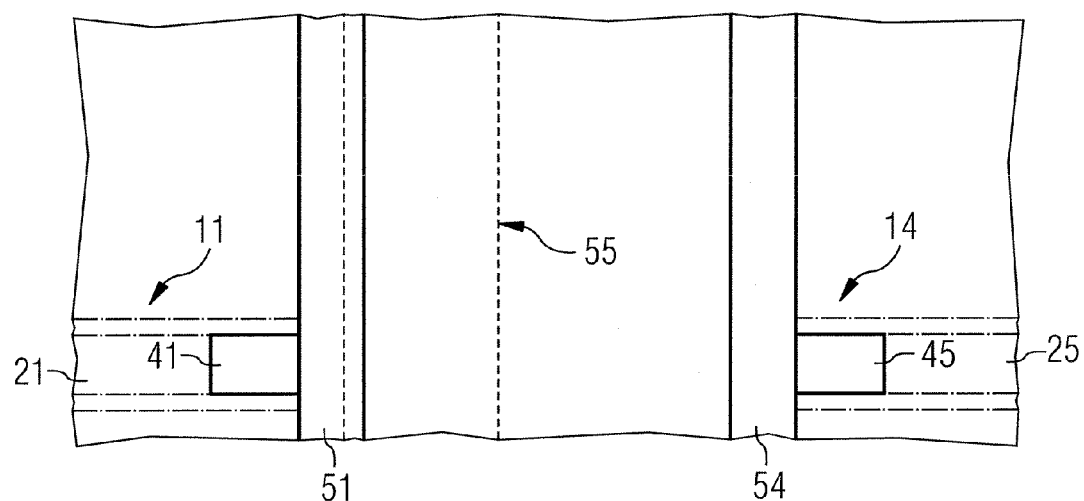
FIG. 5B shows a lateral cross section of the semiconductor body shown in FIG. 5A.

The trench connection lines according to the invention are also suitable for contact-connecting active component zones of semiconductor components arranged in a semiconductor body 100, as is explained below with reference to FIGS. 5A and 5B. In this case, FIG. 5A shows the semiconductor body 100 in side view in cross section, while FIG. 5B illustrates a lateral cross section through the sectional plane E-E depicted in FIG. 5A. In this exemplary embodiment, a lateral MOSFET is integrated in the semiconductor body 100, said lateral MOSFET having a source zone 51 of a first conduction type, a drain zone 54 arranged in a manner spaced apart from the source zone 51 in the lateral direction, a drift zone 53, which adjoins the drain zone 54 and is doped more weakly than the drain zone 54, and also a body zone 52, which is arranged between the drift zone 53 and the source zone 51 and is doped complementarily with respect to the source zone 51. In order to control an inversion channel in the body zone 52 between the source zone 51 and the drift zone 53, a gate electrode 55 is present, which is insulated from the semiconductor body 100 by a gate insulation 56. In the example, said gate electrode 55 is arranged above the front side 101 of the semiconductor body. In the lateral MOS transistor illustrated, the drift zone 53 serves for increasing the dielectric strength of the component. In the case of logic components, in which only a low dielectric strength is required, said drift zone can be dispensed with, if appropriate.

In the case of this component, the source and drain zones 51, 54 are respectively contact-connected by trench connection lines 21, 25. Said trench connection lines are respectively arranged in trenches 11, 14 and electrically conductively connected to the source and drain zones 51, 54 via terminal connections 41, 45. Moreover, the trench connection lines are insulated from the semiconductor body 100 by means of insulation layers 12, 13. In addition, a further insulation layer is present, which covers the trench connection lines 21, 25 in the direction of the front side 101 in order to insulate the trench connection line for example from further interconnects (not illustrated) which may be arranged above the front side 101.

Figure 5C:
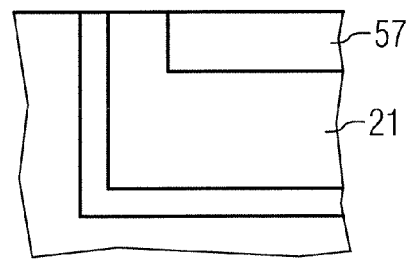
FIG. 5C shows a sectional view of a portion of the semiconductor body shown in FIG. 5A.

The trench connection lines 21, 22 serve for example for connecting the source and drain zones 51, 54 to active component zones of further components (not illustrated) integrated in the semiconductor body, in order thereby to realize an integrated circuit whose wiring does not require any space above the semiconductor body. Furthermore, there is also the possibility of leading the trench connection lines to the front side in a manner spaced apart from the source and drain zones 51, 54 contact-connecting them, in order to connect them, at said front side, to an external terminal potential via terminal contacts, as is illustrated for the trench connection line 21 in FIG. 5c.

The trench connection lines described above at least partially may be produced by the same process steps as the gate electrode of a trench power transistor integrated in the semiconductor body. This will be explained below with reference to FIGS. 6 and 7.

Figure 6:
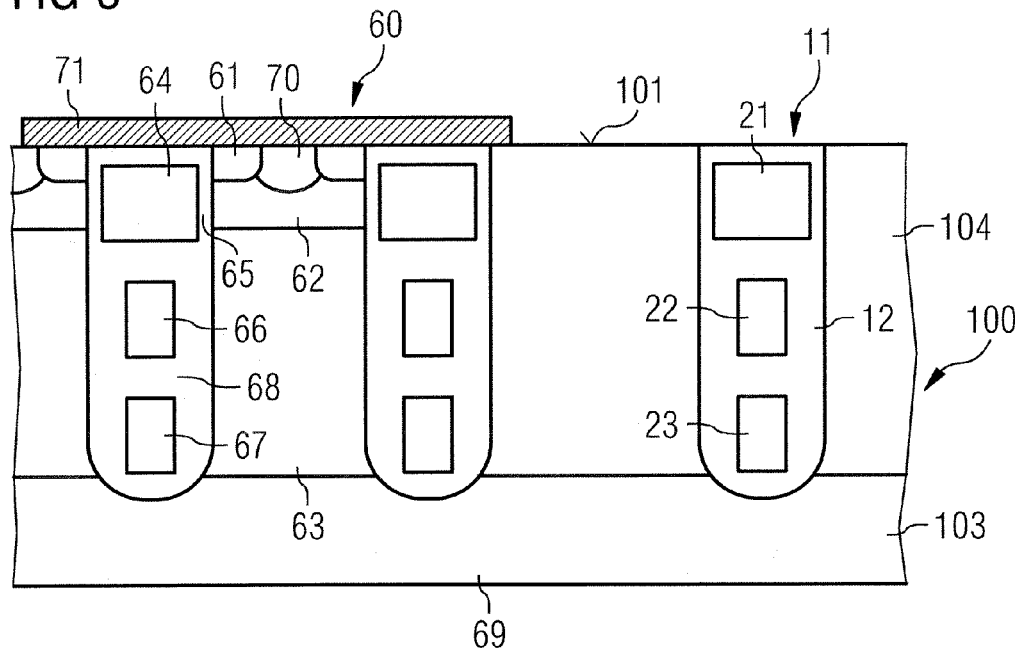
FIG. 6 shows a cross section through a semiconductor body in which a vertical trench transistor and a trench connection line are integrated.

FIG. 6 shows in side view a semiconductor body 100, in which are integrated a transistor structure of a vertical trench power transistor 60 and trench connection lines 21, 22, 23 for the wiring of logic components that are not specifically illustrated and are likewise realized in the semiconductor body 100. The transistor structure 60 is constructed in cellular fashion and comprises a number of in each case identical transistor cells. Each transistor cell comprises, in the vertical direction of the semiconductor body 100, proceeding from the front side 101, a source zone 61 of a first conduction type, a body zone 62 of a second conduction type complementary to the first conduction type, a drift zone 63 of the first conduction type, and also a drain zone 69 of the first conduction type, which is doped more highly than the drift zone 63. In order to realize a MOSFET, the drain zone 69 is doped complementarily with respect to the body zone 62, while the drain zone 69 is doped complementarily with respect to the drift zone 63 in order to realize an IGBT.

In order to control an inversion channel in the body zone 62 between the source zone 61 and the drift zone 63, a gate electrode 64 is present, which is arranged in a trench extending into the semiconductor body in the vertical direction proceeding from the front side 101. Said gate electrode 64 is insulated from the body zone 62 by means of a gate insulation layer 65. Two field electrodes 66, 67 are present in the trench below the gate electrode 64, said field electrodes being insulated from the drift zone 63 by means of a field plate insulation layer 68.

In the present case, the semiconductor body 100 comprises a highly doped semiconductor substrate 103, which forms the drain zone 69, and also a more weakly doped epitaxial layer 104, which is applied to the semiconductor substrate 103 and which forms the drift zone 63 in sections and in which the source and body zones 61, 62 are realized in the region of the front side 101. The transistor structure illustrated in the left-hand part in FIG. 6 is known in principle and described in DE 103 39 455 C1, which is incorporated herein by reference.

The gate electrode 64 and the field electrodes 66, 67 are produced in a known manner by etching a trench starting from the front side of the semiconductor body 100, by producing a dielectric layer on sidewalls of the trench and by depositing of electrode layers, which form the field electrodes 66, 67 and the gate electrode 64. For the arrangement of FIG. 6 first the lower (second) field electrode 67 is produced by depositing a first electrode layer. This electrode layer may be etched back in a vertical direction in order to adjust the dimension of the lower field electrode in the vertical direction. Subsequently a dielectric layer is produced on the lower field electrode 67, for example, by depositing a dielectric or by partially oxidizing the lower field electrode 67. In a corresponding manner the upper (first) field electrode 66 and the gate electrode 64 may be produced. By means of the same process steps which are used for producing the gate electrode 64 and the field electrodes 66, 67 in the trenches of the transistor structure, at least parts of the trench wiring or the trench connection lines are produced, namely those parts of the trench wiring which—corresponding to the field electrodes 66, 67 and the gate electrode 64—extend in a lateral direction of the semiconductor body 11 and therefore run parallel to the front side 101.

The body zones 62, as well as the source zones 61 and the connecting zones 70 may be produced before or after producing the trench structures with the gate and field electrodes 64, 66, 67 and the connection lines 21, 22, 23. These semiconductor zones may be produced by implantation and/or diffusion of dopants into the semiconductor layer 104.

Those section of the trench connection lines, which extend in a vertical direction 100 of the semiconductor body, and which therefore run perpendicular to the front side 101, may be produced by simple modifications of the method discussed above. Such a section running perpendicular to the surface, for example, is the section 23' of FIG. 2B, which connects two lines 22, 23 which are parallel to one another. Such connection may be produced by removing a dielectric separating the lines 22, 23 in an area, in which the connection 23' is to be produced, before an electrode layer for producing the second connection line 22 is deposited. Alternatively, producing a dielectric in the area of this connection 23' may be prevented after an electrode layer forming the lower line 22 has been deposited.

The aforementioned DE 103 39 455 C1 describes connecting the individual field electrodes of the transistor structure to different electrical potentials. In the case of the arrangement illustrated in FIG. 6, the field electrodes 66, 67 can be connected, in a manner not specifically illustrated, via trench connection lines to suitable potential sources that provide the desired different potentials. Said potentials may be generated for example using a Zener diode chain comprising a plurality of series-connected Zener diodes across which a supply voltage is present. In this case, different potentials can be tapped off at intermediate taps of the Zener diode chain, that is to say at connection points of in each case two Zener diodes directly connected in series.

The source zones 61 of the transistor structure are jointly connected to a source electrode 71, which also makes contact with the body zone 62 via highly doped terminal zones 71 in order thereby to short-circuit source and body in a known manner. In the logic portion, for which trench connection lines 21, 22, 23 are illustrated in a representative manner in FIG. 6, there is the possibility of arranging interconnects above the front side 101 of the semiconductor body in accordance with FIGS. 3A and 3B.

Figure 7:
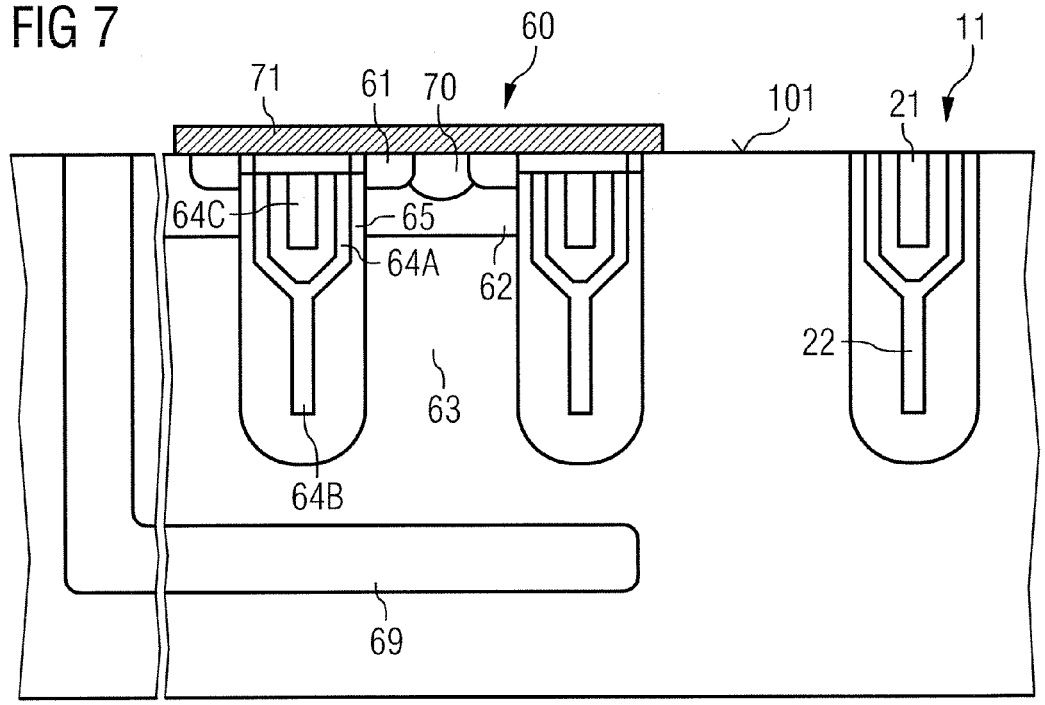
FIG. 7 shows a further exemplary embodiment of a component arrangement in which a vertical trench transistor and a trench connection line are integrated.

FIG. 7 shows a further semiconductor component arrangement, in which a trench transistor structure and trench connection lines are integrated in a common semiconductor body 100. The trench power transistor structure illustrated in FIG. 7 is known in principle from DE 100 63 443 A1 and differs from that illustrated in FIG. 6 by virtue of the fact that an electrode 64A is present, which, in the upper region of the trench, that is to say in the region of the body zone 62, is insulated from the body zone 62 by a gate insulation layer 65, which is thin in comparison with a field plate dielectric 68, and acts as a gate electrode there, while in the lower region of the trench it is insulated from the drift zone 63 by the thicker field plate dielectric 68 and acts as a field plate 64B there. In the upper region of the trench, the gate electrode has a forked structure enclosing a further electrode section 64C in the lateral direction, said further electrode section usually also being connected to gate potential.

In the example illustrated, the drain zone 69 of the transistor structure 60 is realized as a buried highly doped zone which is led to the front side 101 at the edge of the cell array comprising the individual transistor cells of the transistor structure.

The method for producing this gate electrode formed in forked fashion with the further electrode 72 enclosing it can be used correspondingly for realizing at least parts of two trench connection lines 21, 22 that are electrically insulated from one another, and that are arranged in a further trench 11 which is spaced apart from the trench transistor structure 60. The method, in particular, is suitable for producing those parts of the connection lines 21, 22 that run parallel to the front side of the semiconductor body.

In the component structures of FIGS. 6 and 7 the trench transistor structure besides a gate electrode 64 comprises a field electrode, which together with the gate electrode 64 is disposed in a common trench. The trench connection lines disclosed in these figures comprise a number of lines which corresponds to the number of gate and field electrodes of the transistor structure. It should be mentioned in this connection that the transistor structure not necessarily comprises a field electrode. Thus, only a gate electrode may be produced. In this case the trench wiring comprises only one line.

Furthermore, the number of parallel trench connection lines may be lower than the number of electrodes of the transistor structure. In this case the method is modified in such a manner that an area of the semiconductor body 100, in which the trench wiring is produced, is masked during deposition of at least one of the electrode layers forming the electrodes. Alternatively, the method is modified in such a manner that one of the deposited electrode layers is removed in this area.

A method in which at the same time with producing an electrode structure 64-66 in a transistor trench of a semiconductor body 100 at least parts of a trench wiring structure 21-23 is produced, results to a component structure which comprises connection lines, that at least partially or in sections have identical geometrical structures as the electrode structure 64-66 of the transistor. The connection lines may be comprised of the same material as the electrodes 64-66 of the transistor and may be insulated by the same dielectric material against one another and against the semiconductor material of the semiconductor body 100. The electrodes 64-66 and the connection lines 21-23, for example, are comprised of a doped polysilicon of the same doping concentration.

Figure 8A:
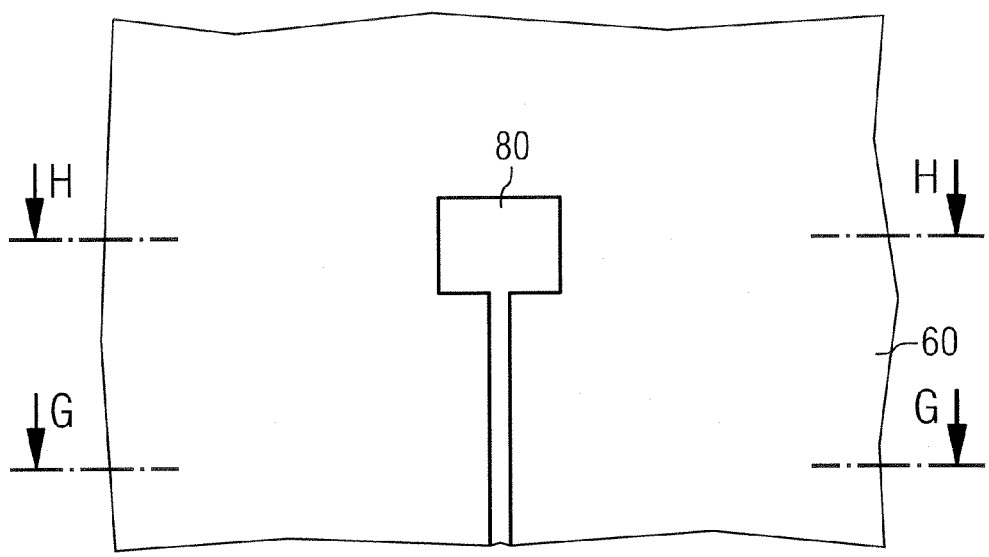
FIG. 8A shows a semiconductor body in which a cell array of a power transistor and a temperature sensor which is contact-connected by a trench connection line and is partly surrounded by the cell array are integrated.
Figure 8B:
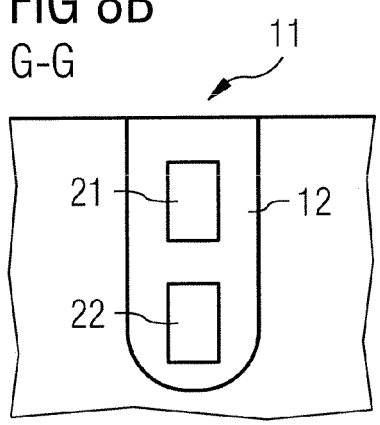
FIG. 8B shows a plan view of the semiconductor body of FIG. 8A.

A further possible application of the trench connection lines explained above is explained below with reference to FIGS. 8A to 8C. FIG. 8A shows in plan view a semiconductor body 100, in which a cell array comprising transistor cells constructed identically in each case is realized. Said transistor cells may be for example transistor cells in accordance with FIGS. 6 and 7 or arbitrary further transistor cells. A temperature sensor 80 is present in a manner surrounded by the transistor cells of said transistor cell array, said temperature sensor serving for detecting the temperature within the cell array. With regard to a temperature measurement that is as exact as possible, it is desirable in this case for the temperature sensor 80 to be surrounded as completely as possible by the transistor cells of the cell array in the lateral direction of the semiconductor body 100. In this context, it is necessary to avoid wide connection lines at the surface of the semiconductor body since no transistor cells can be realized below said connection lines. The trench connection lines explained above make it possible to realize a space-saving line routing to the temperature sensor 80. FIG. 8B shows said trench connection lines 21, 22 in cross section, each of said connection lines respectively contact-connecting one of two terminal contacts of the temperature sensor 80.

Figure 8C:
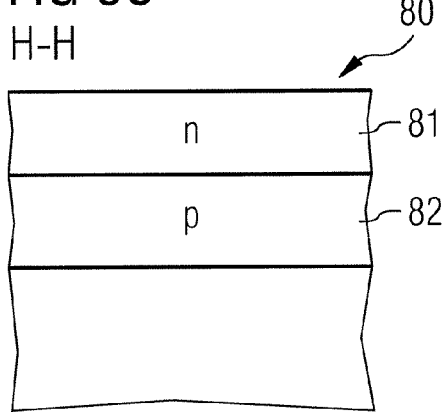
FIG. 8C shows a schematic view of the temperature sensor of FIG. 8A.

Referring to FIG. 8C, the temperature sensor 80 is realized for example as a pn junction with an n-doped zone 81 and a p-doped zone 82, said pn junction being operated in the reverse direction. This makes use of the fact that the reverse current of such a reverse-biased pn junction raises exponentially with the temperature. The upper one of the trench connection lines 21, 22 arranged in the trench 100 makes contact with the n-type zone 81, for example, while the lower one makes contact with the p-type zone 82 of the temperature sensor 80.

The trench connection lines discussed above which, at least partially, are produced by the same process steps as an electrode structure of a trench transistor may also serve as capacitive structures within the semiconductor body 100, as will be explained in the following.

Figure 9A:
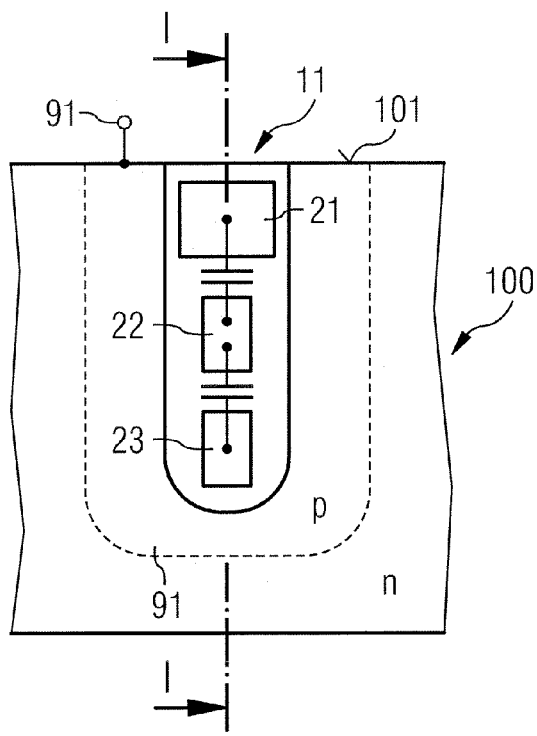
FIG. 9A illustrates a cross sectional view of the realization of capacitive structures using the structures which are used for the realization of trench connection lines.
Figure 9B:
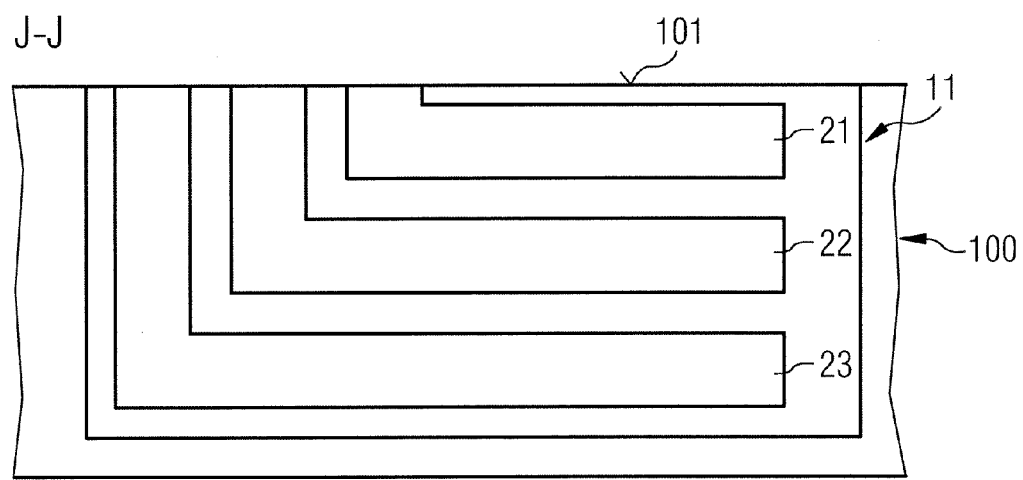
FIG. 9B illustrates a side view of the structures of FIG. 9A.

FIG. 9A shows a cross section through a semiconductor body 100 having a trench 11 with trench connection lines 21-23 arranged therein. In each case two adjacent trench connection lines from among said trench connection lines form a capacitor electrode of a capacitor. This presupposes that the two adjacent trench connection lines are in each case electrically contact-connected only at one side, while the other side of the connection line remains open. This is illustrated in side view in cross section in FIG. 9B. In this example, the trench connection lines in each case end within the trench 11, while their other ends are led to the front side 101 in order to be contact-connected there. The capacitor dielectric is formed by the insulation layer or dielectric layer 12 arranged between the individual trench connection lines 21-23 within the trench 11.

The circuit symbols of the capacitors formed by in each case two adjacent trench connection lines are likewise depicted in FIG. 9A.

What is more, there is also the possibility of using a semiconductor region 91 surrounding the trench, which semiconductor region is preferably doped complementarily to a basic doping of the semiconductor body 100, as a capacitor electrode and of using the trench connection lines 21, 22, 23 in each case as other capacitor electrode, said trench connection lines optionally being connected to a common electrical potential in order to realize a capacitive structure having a particularly high capacitance. In FIG. 9A, the reference symbol 92 designates a terminal of the semiconductor region 91 that surrounds the trench and forms a capacitor electrode.

What is more, there is also the possibility of realizing a plurality of separate capacitors by connecting the individual trench connection lines 21-23 to separate electrical potentials.

A particularly effective method for realizing a power transistor structure and a capacitor structure in a common semiconductor body, in which largely common method steps are used for producing the power transistor structure and the capacitor structure, is explained below with reference to FIGS. 10A to 10E.

FIG. 10A shows in side view a cross section through a semiconductor body 200 having a first side 201, which is referred to hereinafter as the front side, and a second side 202, which is referred to hereinafter as the rear side.

In the example, the semiconductor body 200 comprises a semiconductor substrate 205 and an epitaxial layer 206 applied to the semiconductor substrate 205. In FIG. 10A, the reference symbol 203 designates a section of the semiconductor body in which a transistor structure is intended to be realized, and the reference symbol 204 designates a section of the semiconductor body 200 in which a capacitor structure is intended to be realized. Said sections 203, 204 are referred to hereinafter as transistor section and capacitor section of the semiconductor body 200.

FIG. 10A shows the semiconductor body 200 after first method steps involving the production of trenches 211, 212 in the region of the transistor section 203 and trenches in the region of the capacitor section 204. Said trenches 211, 212 are referred to hereinafter as transistor trenches 211 and capacitor trenches 212.

Said trenches 211, 212 are produced in a known manner by applying a patterned etching mask 300 to the front side 101, for example an oxide hard mask, and subsequently etching the semiconductor body 200 in the regions in which the etching mask 300 has cutouts which define the trenches. In this case, the dimensions of the trenches 211, 212 in a lateral direction of the semiconductor body 200 are dependent on the dimensions of the openings of the etching mask 300.

The trenches 211, 212, running in elongated fashion in a direction perpendicular to the plane of the drawing illustrated in FIG. 10A, can be produced in such a way that the transistor trenches 211 have a width identical to that of the capacitor trenches 212, but the trenches 211, 212 may also have different widths. Said trenches 211, 212 are preferably produced in such a way that the capacitor trenches 212 are wider than the transistor trenches 211. In this case, the "width" denotes the dimensions of the trenches 211, 212 transversely with respect to their longitudinal direction.

The transistor and capacitor trenches 211, 212 may furthermore also have different depths, that is to say different dimensions in a vertical direction of the semiconductor body 200. When carrying out an anisotropic etching method for producing the trenches 211, 212, the depth of the latter can be set by way of the width of the cutouts in the etching mask. For a given etching duration, the trench depth is all the greater, the wider the cutouts. However, the transistor trenches and capacitor trenches 211, 212 formed with this method have the same geometry or the same geometrical basic structure in a vertical section plane. The geometry of one trench is, for example, defined by a ratio between the depth and the width of the trench, an angle between the sidewalls of the trenches and a vertical direction, etc.

Figure 10B:
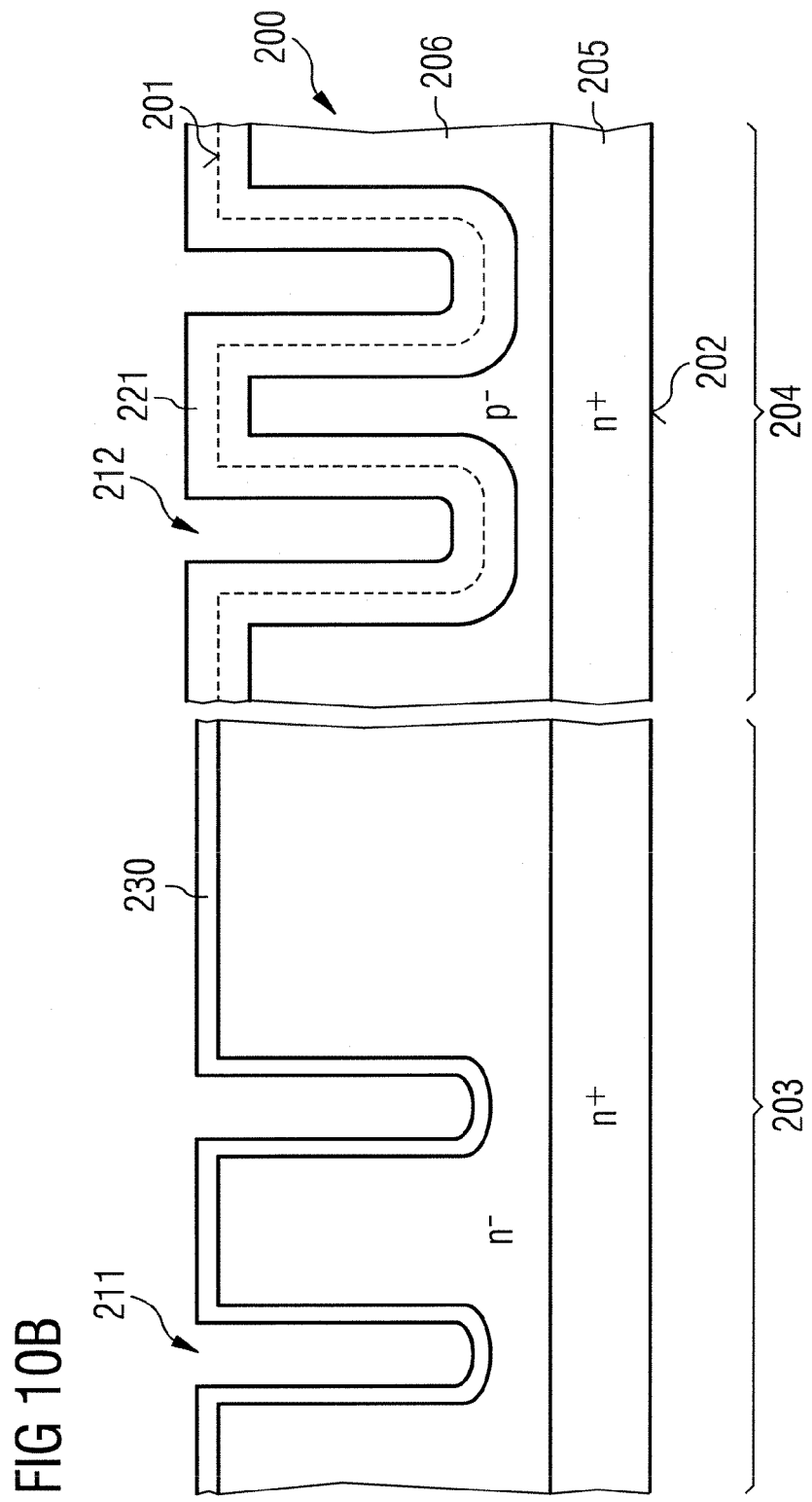
FIG. 10B illustrates the structures shown in FIG. 10A after performance of further steps of the production method.

The transistor trenches 211 can be implemented as longitudinal trenches which each have a length in a direction perpendicular to the section plane illustrated in FIG. 10A. According to one embodiment, a length of the transistor trenches 211 is at least 10 times of their width. The width of the transistor trenches 211 is their dimension in the lateral direction of the semiconductor body 200 in the section plane illustrated in FIG. 10B. According to one embodiment, the capacitor trenches 212 are also implemented as longitudinal trenches which have a length which is at least 10 times their widths. In the horizontal plane—which is a plane perpendicular to the section plane illustrated in FIG. 10A—longitudinal trenches have a rectangular geometry with a length-to-width ratio of at least 10.

According to another embodiment the capacitor trenches have a polygonal shape with a width and a length in the horizontal plane, the length of the capacitor trenches 212 being smaller than 10 times of their width.

According to another embodiment, the capacitor trenches 212 are not implemented as longitudinal trenches, but are implemented as pile-shaped trenches. In the horizontal plane, these trenches may have a square geometry, a hexagonal geometry, an octagonal geometry, or a circular geometry. Nevertheless, there is one vertical section plane—like the section plane illustrated in FIG. 10A—in which these trenches have the same geometry.

FIG. 10B shows the semiconductor body 200 after further method steps involving the production of a dielectric layer 221 in the capacitor trenches 212 and on the front side 201 of the capacitor section 204. Said dielectric layer 221 is an oxide layer, for example, which is produced after the removal of the etching mask (reference symbol 300 in FIG. 10A) by thermal oxidation of uncovered areas of the capacitor section 204, that is to say the front side of the semiconductor body 200 in said capacitor section 204 and the sidewalls of the trenches 212. Said oxidation layer 221 grows onto the semiconductor body in the capacitor section 204, semiconductor materials "being consumed". The dash-dotted line in FIG. 10B shows the course of the surface of the capacitor section 204 before the thermal oxidation for the production of the dielectric layer 221.

Before the thermal oxidation of the capacitor section 204 is carried out, an oxidation protection layer 230 is applied to uncovered surface regions of the transistor section 203, which layer prevents the production of an oxidation layer on the surface of the semiconductor body 200 in the transistor section 203. Said oxidation protection layer 230 is a nitride layer, for example.

Figure 10C:
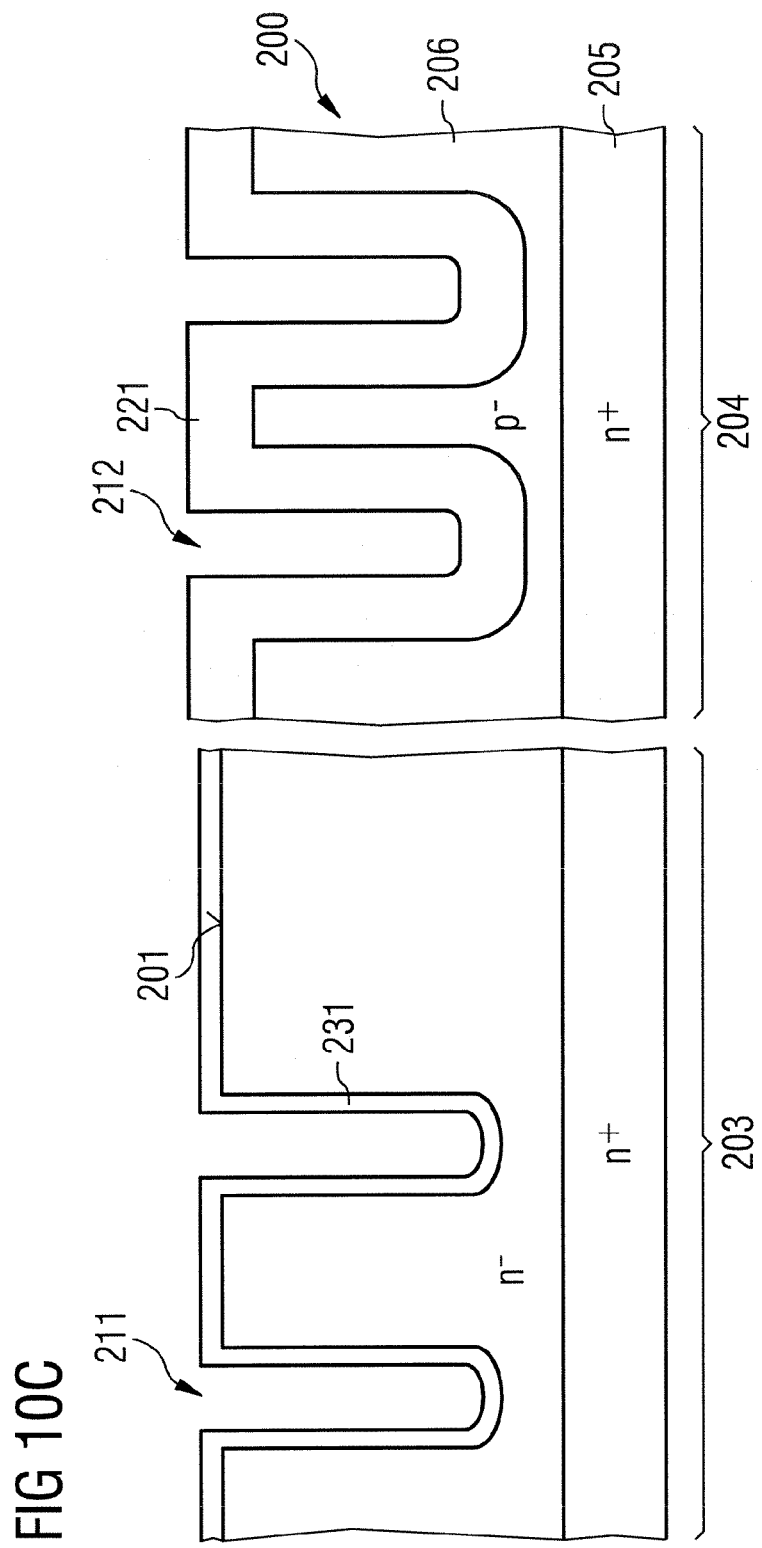
FIG. 10C illustrates the structures shown in FIG. 10B after performance of further steps of the production method.

FIG. 10C shows the semiconductor body 200 in cross section after further method steps involving the removal of the oxidation protection layer 230 and the production of a gate dielectric layer 241 at the sidewalls of the transistor trenches 211. Said gate dielectric layer is an oxide layer, for example, which is produced by means of a thermal oxidation, the oxidation conditions being set such that the gate insulation layer is thinner than the capacitor dielectric layer 221 of the capacitor section 204. On account of the oxidation of the semiconductor body in the transistor section, an insulation layer also arises above the front side 201 of the semiconductor body, which is removed again in a later method step.

It should be noted, that the dielectric layer 221 and the gate dielectric 231 can be produced from dielectric materials other than an oxide as well. According to a further embodiment, at least one of the dielectric layer 221 and the gate dielectric 231 includes a layer stack with at least two different dielectric layers. According to one embodiment, the layer stack is an ONO-stack including an oxide (O) layer, a nitride (N) layer and an oxide (O) layer, arranged in the order as mentioned.

Figure 10D:
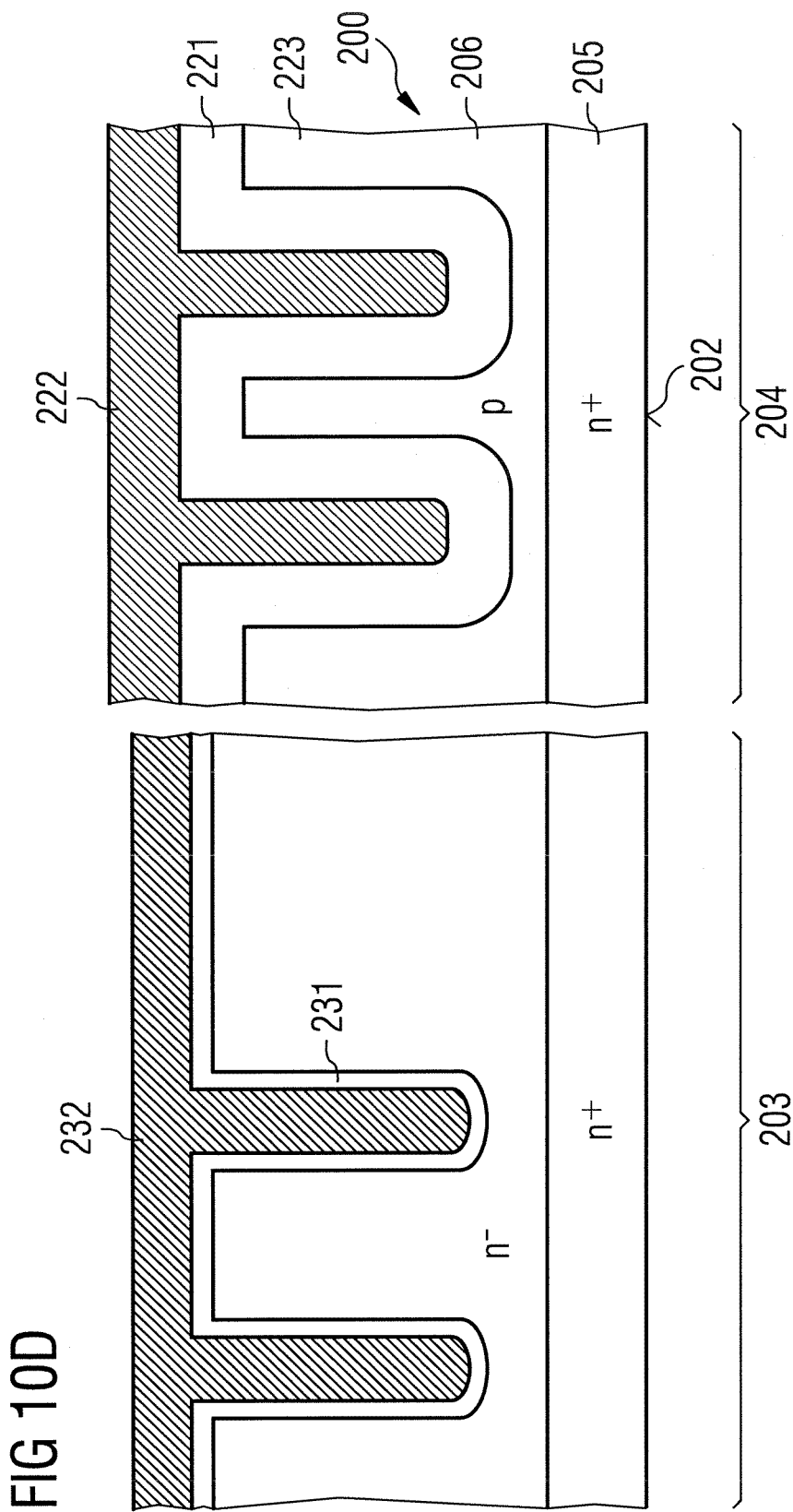
FIG. 10D illustrates the structures shown in FIG. 10C after performance of further steps of the production method.

In further method steps, the result of which is illustrated in FIG. 10D, an electrode layer 222, 232 is jointly deposited onto the capacitor section 204 and the transistor section 203. Said electrode layer forms a capacitor electrode 222 in the capacitor section 204 and the later gate electrode of the power transistor structure in the transistor section.

The capacitor structure is completed after these method steps. Said capacitor structure is formed by the capacitor electrode 222, the capacitor dielectric 221 and a semiconductor zone 223 surrounding the trenches with the capacitor dielectric 221. Said semiconductor zone 223 is for example doped complementarily with respect to the semiconductor substrate 205 and doped complementarily with respect to the epitaxial layer 206 in the region of the transistor structure 203. The capacitor electrode 222 has a geometry which corresponds to or is defined by the geometry of the capacitor trench 212, so that the capacitor electrode 222 basically has the same geometry as the capacitor trench 212.

The epitaxial layer 206 forms the later drift zone of the component in sections in the region of the transistor structure. A complementary doping of the drift zone and the semiconductor zone 223 that forms a second capacitor electrode avoids shunt currents between these component regions within the semiconductor body 200.

Figure 10E:
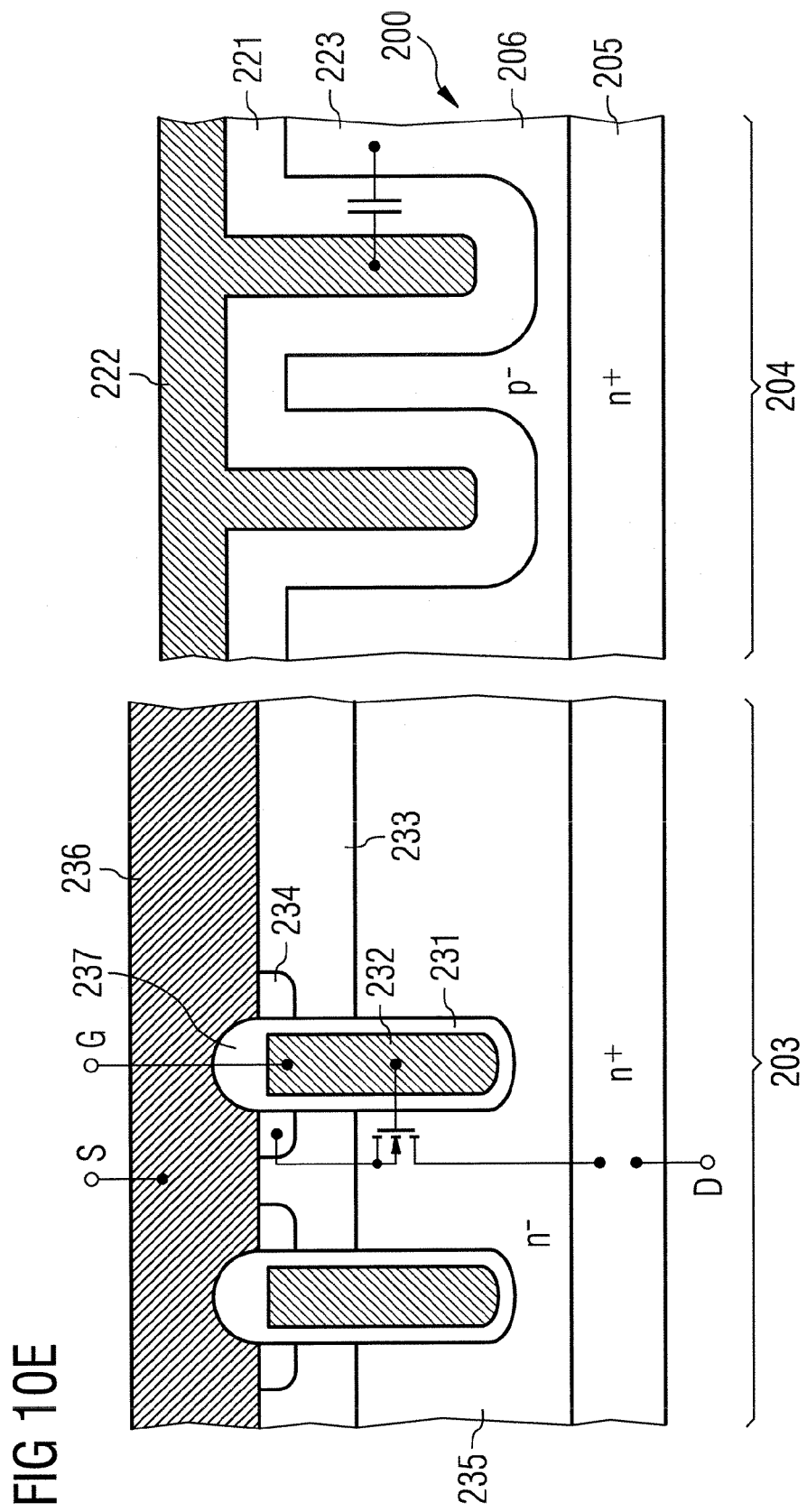
FIG. 10E illustrates the structures shown in FIG. 10D after performance of further steps of the production method.

FIG. 10E shows the semiconductor body 200 in cross section after the performance of further method steps known in principle for completing the transistor structure after the production of the trenches, the gate insulation layer 231 and the gate electrodes 232. Said method steps comprise the removal of the electrode layer 232 from the front side 201 of the semiconductor body 200 in the region of the transistor trenches. Said removal may be effected by means of an etching method, by way of example. In this case, said electrode layer is preferably etched back to an extent such that the gate electrodes 232 end below the front side 201 of the semiconductor body in the trenches 212.

The gate electrode 232 of the transistor structure and those parts of the capacitor electrode 222 arranged in the trenches basically have the same geometry or geometrical basic structure, because of the same geometry of the transistor trenches 211, on the one hand, and the capacitor trenches, on the other hand. The same geometries of the transistor trenches 211 and the capacitor trenches 211 can be obtained by producing the transistor trenches 211 and the capacitor trenches 212 by the same/common method steps. These common method steps may include forming the etch mask 300 (see FIG. 10A) on the semiconductor body 100 and etching the semiconductor body 100 in openings of the etch mask, wherein these openings do not need to have the same sizes.

It should be noted that the method for producing the gate electrodes 232 and the capacitor electrode 222 is not restricted to produce the transistor trenches 211 and the capacitor trenches 212 by common method steps and to also produce the gate electrodes 232 and the capacitor electrode 222 by common method steps.

According to one embodiment, the transistor trenches 211 and the capacitor trenches 212 are formed by common method steps, but the gate electrodes 231 and the capacitor electrode 222 are formed by different method steps. "Forming by different method steps" in this connection means, that there is no common process, like a deposition process, which forms the gate electrodes 232 and the capacitor electrode 222.

According to another embodiment, the transistor trenches 211 and the capacitor trenches 212 are not formed by common method steps, but the gate electrodes 231 and the capacitor electrode 222 are formed by common method steps. These common steps may include a common deposition process, like a deposition process as illustrated in FIG. 10D.

Referring to FIG. 10E, the production of the transistor structure additionally comprises the production of a body zone 233 doped complementarily with respect to a basic doping of the epitaxial layer 206, and also the production of source zones 234 which are doped complementarily with respect to said body zone 233 and which adjoin the trenches with the gate electrode 232 in a known manner. Moreover, a source electrode 236 is produced, which makes contact with the source zones 234 and is insulated from the gate electrodes 232 by further insulation layers 237 above the gate electrodes 232. The source electrode 236 can also make contact with the body zone 233 in a known manner in order to short-circuit source 234 and body 233.

The transistor structure has a cell structure comprising a multiplicity of identically constructed transistor cells each having a gate electrode 232 arranged in a transistor trench. In this context it should be pointed out that the electrode layer can remain, in an edge region of the cell array, above the front side of the semiconductor body 200 in a manner that is not specifically illustrated.

The electrical equivalent circuit diagram of the power transistor is likewise illustrated in FIG. 10E. The drain zone of said power transistor is formed by the semiconductor substrate 205. The power transistor illustrated in FIG. 10E is realized as an n-channel MOSFET. Said transistor may, of course, also be realized as a power IGBT, in which case the semiconductor substrate is to be realized complementarily with respect to the epitaxial layer that forms the drift zone 235.

Figure 11:
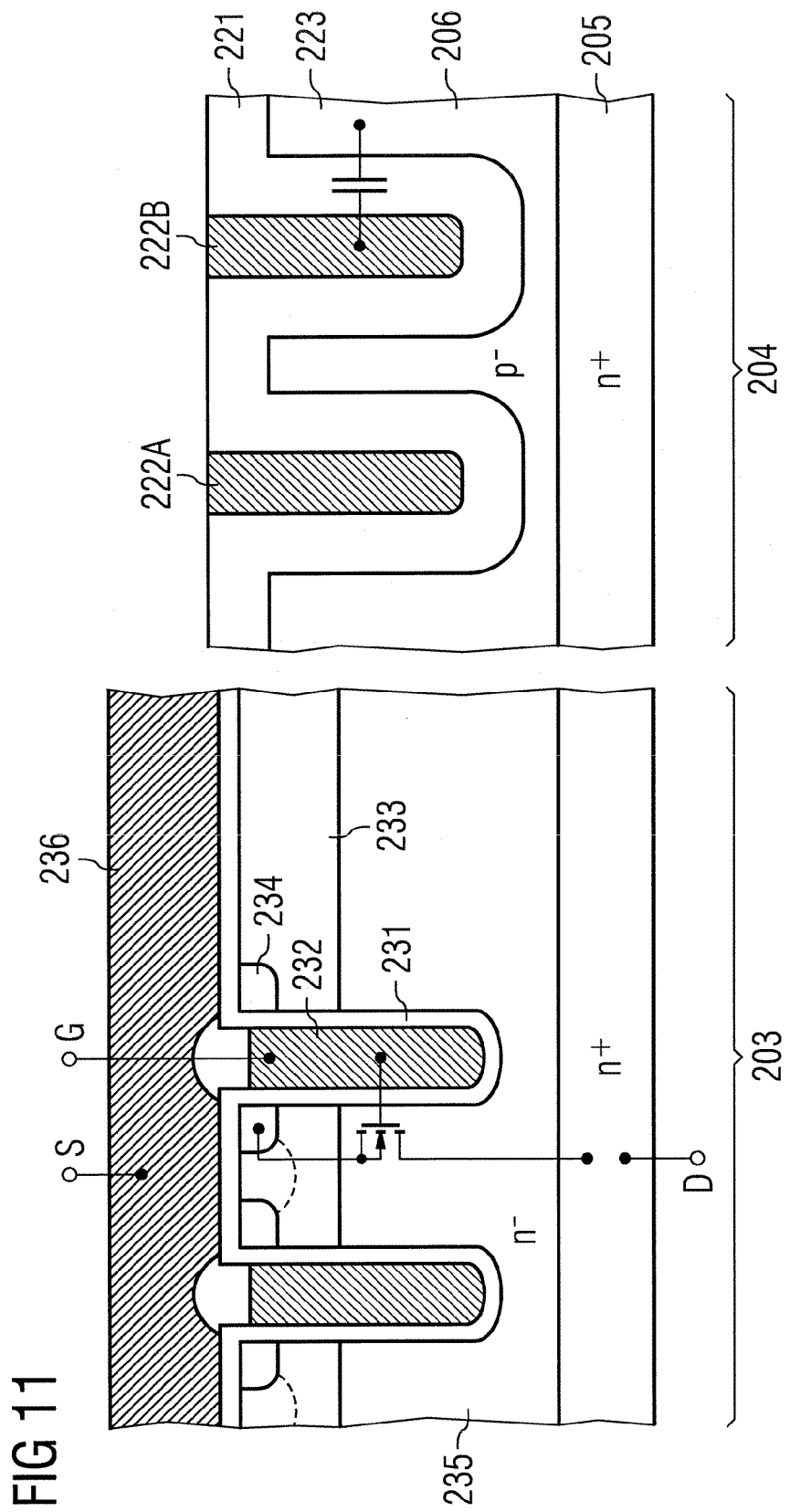
FIG. 11 shows a component arrangement comprising a trench power transistor structure and a capacitor structure which has been produced by means of a modified method by comparison with the method according to FIGS. 10A-10E.

FIG. 11 shows a component arrangement comprising a power transistor structure and a capacitor structure in a common semiconductor body 200, which is produced by means of a modified method by comparison with the method according to FIG. 10. In this method, the electrode layer 222 is also etched back to below the upper edge of the dielectric layer 221 in the region of the capacitor structure, whereby separate electrode sections 222A, 222B are produced in the individual trenches. A plurality of separate capacitors which have a common capacitor electrode with the semiconductor zone 223 can be realized as a result.

FIGS. 12A to 12C illustrate a modification of the method explained above with reference to FIG. 10. Referring to FIG. 12A, in this method, after the production of the transistor and capacitor trenches 211, 212, firstly the gate insulation layer 231 is produced, as a result of which an insulation layer 224 is also produced on the front side 201 and in the capacitor trenches of the capacitor section 204.

Referring to FIG. 12B, the electrode layer 232 is subsequently deposited, which forms the later gate electrodes in the transistor section. In the transistor section, said electrode layer protects the gate insulation layer during subsequent method steps for producing the capacitor dielectric in the capacitor section.

FIG. 12C shows the semiconductor body after the production of said capacitor dielectric 221 and an electrode 225 applied to the capacitor dielectric 221, a function of said electrode corresponding to the electrode 222 in accordance with FIG. 10E. The production of the capacitor dielectric 221 is preceded by the removal of the insulation layers 224 and the electrode layer 232 in the region of the capacitor structure. The production of the capacitor dielectric 221 may be effected in the manner explained by a thermal oxidation or else by deposition of an oxide layer, such as, for example, TEOS layer (TEOS=tetraethoxysilane). After the production of the capacitor dielectric 221, the electrode layer 225 is deposited in a conventional manner. The capacitor structure is completed after the conclusion of these method steps.

It goes without saying that, in accordance with the exemplary embodiment in FIG. 11, there is also the possibility of subdividing this capacitor electrode in order to realize a plurality of capacitors in the capacitor section 204.

The further method steps for completing the transistor structure proceeding from the structure in accordance with FIG. 12C correspond to the method steps explained with reference to FIG. 10E.

FIG. 13 shows as the result a component structure in which the gate dielectric layer 231 and the capacitor dielectric 224 are produced by the same method steps. Such a component may be obtained, proceeding from the method according to FIG. 12, by virtue of the fact that the method steps explained with reference to FIG. 12, involving the production of the gate dielectric 231 in the transistor trenches 211 and the insulation layer 224 in the capacitor trenches by means of common method steps, and involving the production of electrode layers 232, 222 in the transistor and capacitor trenches 211, 212 by means of further common method steps, are followed directly by the method steps explained with reference to FIG. 10E for completing the transistor structure. In this component, the insulation layer produced during the production of the gate dielectric 231 in the transistor trenches forms the capacitor dielectric, and the electrode 222 produced during the production of the gate electrode 232 forms one of the capacitor electrodes. Said electrode 222 may be maintained as a one-piece electrode, as is illustrated in FIG. 13.

Figure 14:
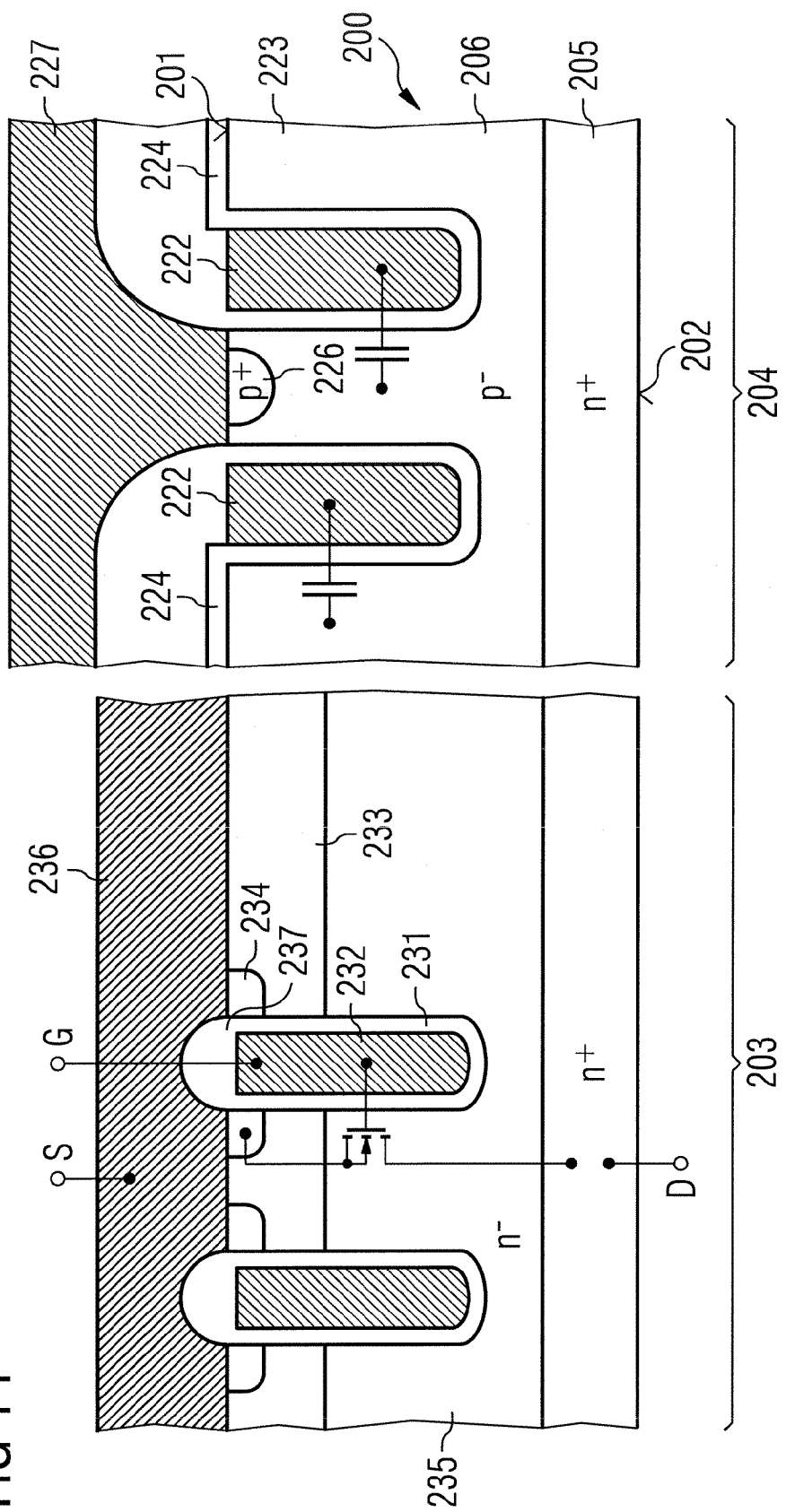
FIG. 14 shows the result of a further modification of the method according to FIGS. 12A-12C.

Referring to FIG. 14, there is furthermore the possibility of etching back said electrode 222 in such a way that individual electrodes arise in the capacitor trenches 212 in order thereby to realize a number of individual capacitors. In this case, the semiconductor region 223 surrounding the trenches forms a common electrode for the individual capacitors. In the component in accordance with FIG. 14, said semiconductor region 223 is contact-connected by a further electrode 227, which is arranged above the semiconductor body 200 and which is insulated from the electrodes 222 arranged in the trenches in a region above the semiconductor body 200 by means of insulation layers 228.

The methods of FIGS. 10 to 14 result to component arrangements having a trench transistor structure and a capacitor structure, with the capacitor structure comprising at least one capacitor electrode disposed in a trench and having at least partially the same geometrical basic structure as the electrode structure of the transistor. "Same geometrical basic structure" in this connection means, that the geometrical structures in general are the same but may vary in terms of their lateral or vertical dimensions. The materials of the electrode structure of the transistor and the materials of the electrode structure of the capacitor are identical.

Figure 15:
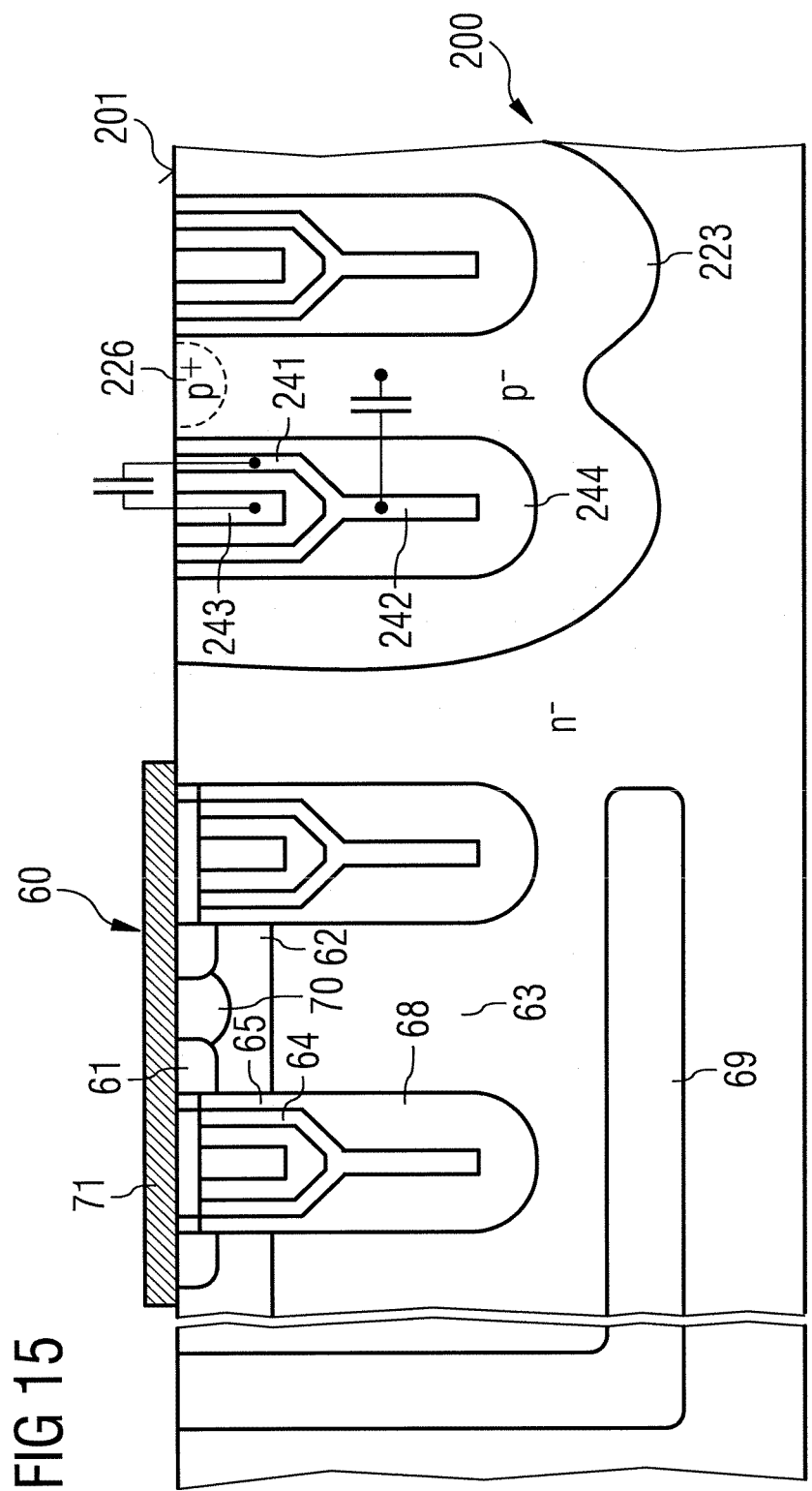
FIG. 15 shows a further component arrangement comprising a transistor structure and a capacitor structure.

FIG. 15 shows a vertical cross section through a further component arrangement having a transistor structure and a capacitor structure. In this case, the transistor structure corresponds to the transistor structure already explained with reference to FIG. 7 and comprises a number of transistor cells having gate electrodes 64 arranged in trenches, which merges into a field plate 64B in the vertical direction of the semiconductor body and which encloses a further electrode section 64C in forked fashion.

The capacitor structure has capacitor electrodes which are arranged in trenches and whose geometry corresponds to that of the gate electrodes 64A, field plates 64B and electrode sections of the transistor structure and which are designated by the reference symbols 241, 242, 243 in FIG. 15. Depending on the contact-connection of the individual electrodes, different capacitors can be formed by this arrangement. If the forked electrodes 241, 242 and the electrode 243 surrounded by the latter are contact-connected separately, then a respective capacitor is formed by each of said forked electrodes 241, 242, by the electrode 243 surrounded by the latter, and by the intervening dielectric.

The trenches with the electrodes 241, 242, 243 are surrounded, in the example, by a semiconductor zone 223 doped complementarily with respect to a basic doping of the semiconductor body 200 and in the example complementarily with respect to the drift zone 63 of the transistor structure. Said semiconductor zone 223 can be contact-connected via a highly doped terminal zone 226 and forms a capacitor electrode. In this arrangement, a capacitor is formed by the semiconductor zone 223, a dielectric 244 arranged in the trenches, and also the forked electrode 241, 242.

The electrode structure produced in trenches together with the electrode structure of the trench transistor—as explained above—at least partially may be used as a wiring structure or as an electrode structure of a capacitor. However, such electrode structure is not limited to this use.

While the invention disclosed herein has been described in terms of several preferred embodiments, there are numerous alterations, permutations, and equivalents which fall within the scope of this invention. It should also be noted that there are many alternative ways of implementing the methods and compositions of the present invention, It is therefore intended that the following appended claims be interpreted as including all such alterations, permutations and equivalents as fall within the true spirit and scope of the present invention.

What is claimed is:

1. A semiconductor component arrangement, comprising:
   a semiconductor body comprising a semiconductor material extending from a first side to a second side spaced apart from the first side in a vertical direction of the semiconductor body, a transistor section, and a capacitor section spaced apart from the transistor section in a lateral direction of the semiconductor body;
   in the transistor section, a vertical trench transistor comprising at least one trench extending into the semiconductor body from the first surface, at least one gate electrode disposed in the at least one trench, a source region, and a drain region spaced apart from the source region in the vertical direction of the semiconductor body; and
   in the capacitor section, a capacitor structure comprising at least one further trench extending into the semiconductor body from the first surface, and a capacitor electrode in the at least one further trench, wherein the capacitor electrode is dielectrically insulated from the semiconductor body by a dielectric layer.

2. The semiconductor component arrangement of claim 1, wherein the transistor structure further comprises a gate dielectric on surfaces of the at least one trench.

3. The semiconductor component arrangement of claim 1, wherein the transistor structure further comprises a field electrode arranged in the at least one trench and dielectrically insulated from the gate electrode and the semiconductor body.

4. The semiconductor component arrangement of claim 1, wherein the capacitor structure further comprises at least one further electrode formed by a region of the semiconductor body which adjoins the at least one further trench.

5. The semiconductor component arrangement of claim 1, wherein the capacitor structure further comprises at least one further electrode formed in the at least one further trench and dielectrically insulated from the at least one electrode.

6. The semiconductor component arrangement of claim 1, wherein the at least one further trench in the capacitor section is wider in a lateral direction of the semiconductor body than the at least one trench in the transistor section.

7. The semiconductor component arrangement of claim 1, wherein the at least one further trench in the capacitor section is deeper in a vertical direction of the semiconductor body than the at least one trench in the transistor section.

8. The semiconductor component arrangement of claim 1, wherein the at least one trench in the transistor section is an elongated trench.

9. The semiconductor component arrangement of claim 8, 
   wherein the at least one trench in the transistor section has a width in a first lateral direction and a length in a second lateral direction,
   wherein the length is at least 10 times the width.

10. The semiconductor component arrangement of claim 1, wherein the at least one further trench in the capacitor section is an elongated trench.

11. The semiconductor component arrangement of claim 10,
   wherein the at least one further trench in the capacitor section has a width in a first lateral direction and a length in a second lateral direction,
   wherein the length is at least 10 times the width.

12. The semiconductor component arrangement of claim 1,
   wherein the vertical trench transistor further comprises a body region and a gate dielectric,
   wherein the gate dielectric dielectrically insulates the gate electrode from the body region.

13. A semiconductor component arrangement, comprising:
   a trench transistor structure including at least one trench disposed in a semiconductor body and at least one gate electrode disposed in the at least one trench, wherein the semiconductor body comprises a semiconductor material extending from a first side to a second side spaced apart from the first side in a vertical direction of the semiconductor body;

a capacitor structure comprising an electrode structure disposed in at least one further trench spaced apart from the at least one trench in a lateral direction of the semiconductor body, the electrode structure comprising at least one electrode; and wherein the gate electrode and the at least one electrode of the electrode structure were produced by common process steps.

14. The semiconductor component arrangement of claim 13, wherein at least one section of the at least one electrode has the same geometrical basic structure as the at least one gate electrode.

15. The semiconductor component arrangement of claim 13, wherein the at least one trench of the transistor structure extends in a vertical direction of the semiconductor body, and wherein the at least one further trench of the capacitor structure extends in the vertical direction of the semiconductor body.

16. The semiconductor component arrangement of claim 13, wherein the transistor structure further comprises:

a source region and a drain region spaced apart from the source region in the vertical direction of the semiconductor body.

* * * * *